United States Patent
Sawachi et al.

(10) Patent No.: US 10,229,844 B2
(45) Date of Patent: Mar. 12, 2019

(54) GAS SUPPLY SYSTEM, GAS SUPPLY CONTROL METHOD AND GAS REPLACEMENT METHOD

(71) Applicant: TOKYO ELECTRON LIMITED, Tokyo (JP)

(72) Inventors: Atsushi Sawachi, Miyagi (JP); Norihiko Amikura, Miyagi (JP); Yoshiyasu Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 179 days.

(21) Appl. No.: 15/183,891

(22) Filed: Jun. 16, 2016

(65) Prior Publication Data
US 2016/0372348 A1 Dec. 22, 2016

(30) Foreign Application Priority Data
Jun. 19, 2015 (JP) .................................. 2015-123703

(51) Int. Cl.
| | |
|---|---|
| C23C 16/455 | (2006.01) |
| H01J 37/32 | (2006.01) |
| H01L 21/67 | (2006.01) |
| G05D 7/06 | (2006.01) |
| G01F 1/684 | (2006.01) |
| H01L 21/311 | (2006.01) |

(52) U.S. Cl.
CPC ...... *H01L 21/67069* (2013.01); *C23C 16/455* (2013.01); *C23C 16/45561* (2013.01); *G01F 1/684* (2013.01); *G05D 7/0635* (2013.01); *H01J 37/32009* (2013.01); *H01J 37/3244* (2013.01); *H01J 37/32449* (2013.01); *H01J 37/32834* (2013.01); *H01L 21/67017* (2013.01); *H01L 21/67253* (2013.01); *H01J 2237/334* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 5,439,026 A | * | 8/1995 | Moriya | G05D 7/0635 137/486 |
| 2011/0108126 A1 | * | 5/2011 | Monkowski | G05D 7/0635 137/551 |

(Continued)

FOREIGN PATENT DOCUMENTS

| | | |
|---|---|---|
| JP | 2003-086579 A | 3/2003 |
| JP | 2006-242222 A | 9/2006 |
| JP | 5020758 B | 6/2012 |

*Primary Examiner* — Binu Thomas
(74) *Attorney, Agent, or Firm* — Pearne & Gordon LLP

(57) ABSTRACT

Throughput of the processing can be improved. A gas supply system includes a plurality of element devices which constitute the gas supply system and a base 212 on which the plurality of element devices are disposed. Some of the element devices are disposed on a surface 212a of the base 212, and the others are disposed on a surface 212b of the base 212, which is opposite to the surface 212a of the base 212. The plurality of element devices may be implemented by, for example, a flow rate controller FD and a secondary valve FV2. The secondary valve FV2 is disposed on the surface 212b, which is opposite to the surface 212a of the base 212 where the flow rate controller FD is disposed.

5 Claims, 22 Drawing Sheets

(56) References Cited

U.S. PATENT DOCUMENTS

| | | | |
|---|---|---|---|
| 2012/0279592 A1* | 11/2012 | Manofsky, Jr. | G05D 7/00 137/597 |
| 2016/0011604 A1* | 1/2016 | Mudd | G05D 7/0635 137/599.11 |
| 2016/0041564 A1* | 2/2016 | Mudd | G05D 7/0641 700/275 |
| 2016/0299514 A1* | 10/2016 | Ono | G05D 7/0647 |

\* cited by examiner

FIG. 4A
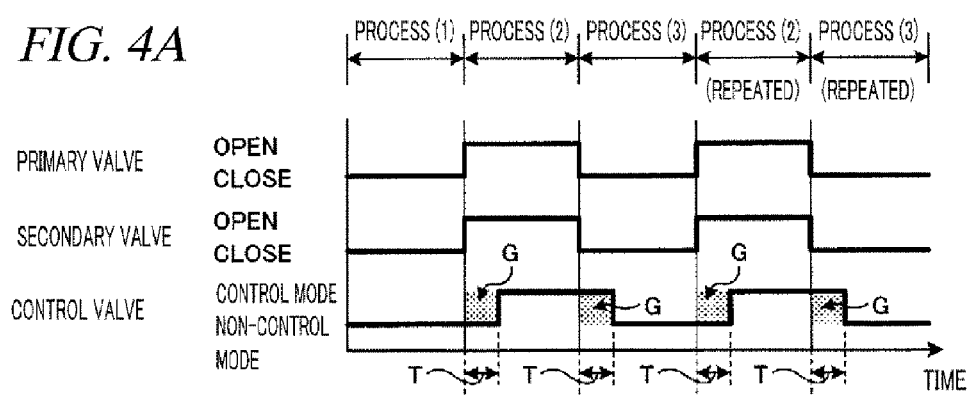
FIG. 4B
PRESSURE WITHIN FD
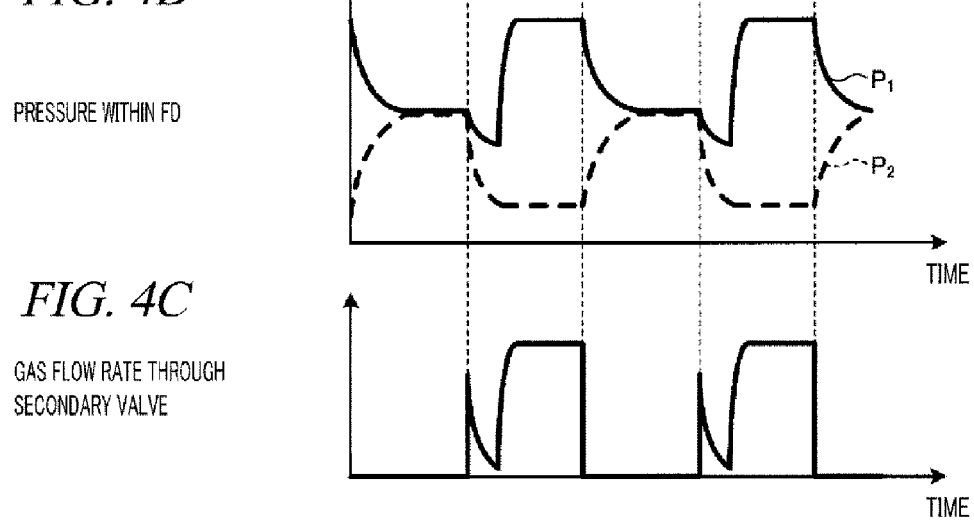
FIG. 4C
GAS FLOW RATE THROUGH
SECONDARY VALVE

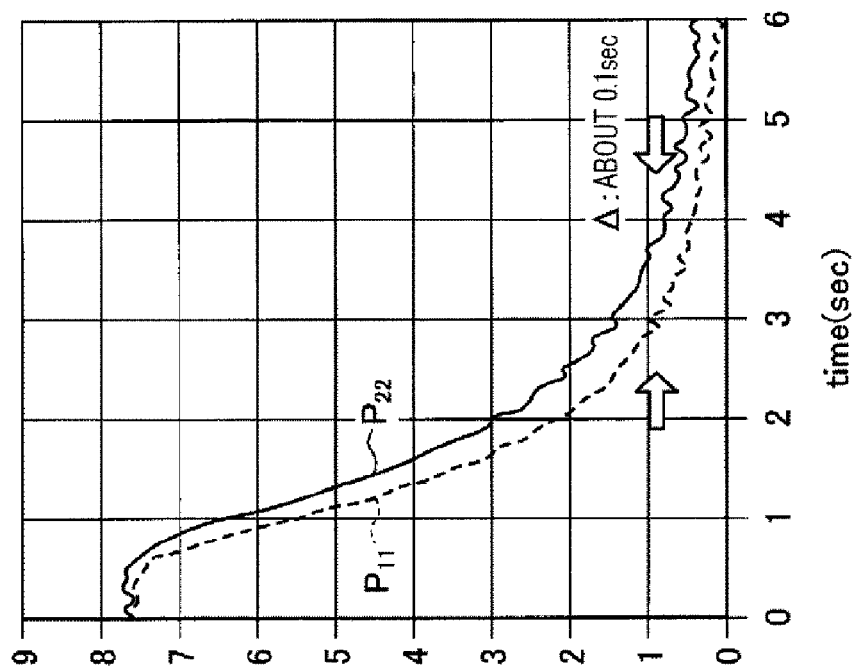
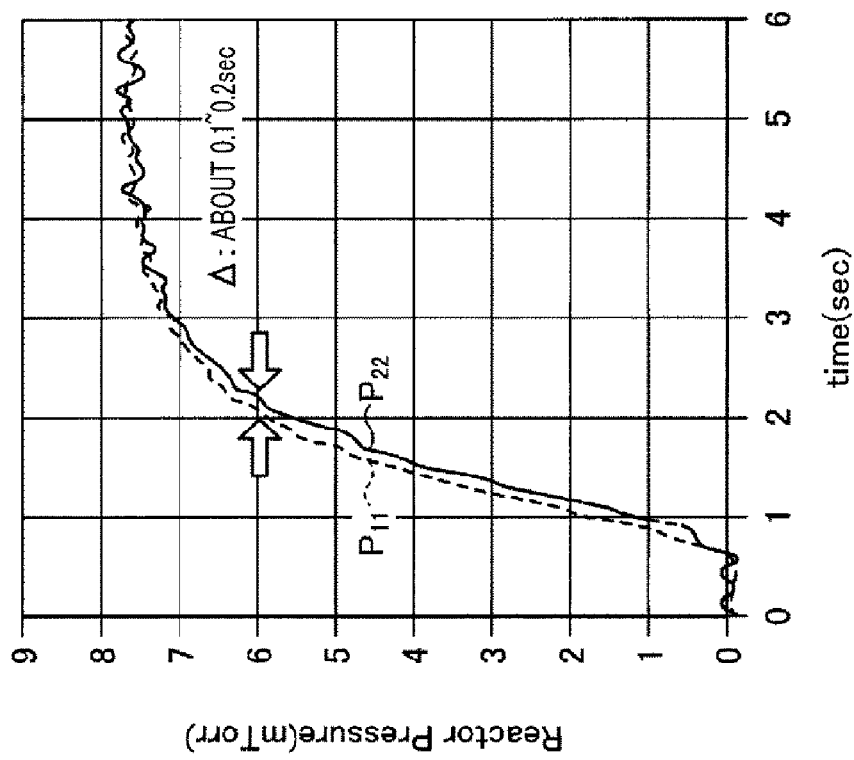

FIG. 24

| | PROCESS ST35 | | PROCESS ST37 | | PROCESS ST35 | | PROCESS ST37 | | PROCESS ST35 | | PROCESS ST37 | |
|---|---|---|---|---|---|---|---|---|---|---|---|---|
| | GAS TYPE | FLOW RATE (SCCM) | GAS TYPE | FLOW RATE (SCCM) | GAS TYPE | FLOW RATE (SCCM) | GAS TYPE | FLOW RATE (SCCM) | GAS TYPE | FLOW RATE (SCCM) | GAS TYPE | FLOW RATE (SCCM) |
| GAS A | $O_2$ | 75 | $O_2$ | 40 | $O_2$ | 40 | $O_2$ | 40 | $O_2$ | 40 | $O_2$ | 40 |
| | Ar | 100 | Ar | 200 | Ar | 200 | Ar | 200 | Ar | 200 | Ar | 200 |
| | $CF_4$ | 125 | | | | | $SiCl_4$ | 25 | $SiCl_4$ | 25 | $SiCl_4$ | 25 |
| GAS B | $O_2$ | 40 | $O_2$ | 40 | $O_2$ | 75 | $O_2$ | 75 | $O_2$ | 40 | $O_2$ | 40 |
| | Ar | 200 | Ar | 200 | Ar | 100 | Ar | 100 | Ar | 200 | Ar | 200 |
| | $SiCl_4$ | 25 | $SiCl_4$ | 25 | $CF_4$ | 125 | $CF_4$ | 125 | | | | |

GAS SUPPLY SYSTEM, GAS SUPPLY CONTROL METHOD AND GAS REPLACEMENT METHOD

CROSS-REFERENCE TO RELATED APPLICATION

This application claims the benefit of Japanese Patent Application No. 2015-123703 filed on Jun. 19, 2015, the entire disclosures of which are incorporated herein by reference.

TECHNICAL FIELD

The embodiments described herein pertain generally to a gas supply system, a gas supply control method and a gas replacement method.

BACKGROUND

With regard to a processing apparatus which processes a processing target object such as a semiconductor wafer with plasma of a processing gas or the like, there is known a gas supply apparatus configured to control a supply of the processing gas into the processing apparatus. Such a gas supply apparatus includes element devices such as a flow rate controller which control a flow rate of a gas, a plurality of valves which control a supply of the gas or a stop of the supply of the gas, and so forth. These element devices are connected with a pipeline through which the gas is flown, and are arranged on the same surface of a base.

Further, the element devices such as the flow rate controller or the valves are arranged on the same surface of the base, and neighboring element devices may be connected with a pipeline which penetrates the base. With this configuration, the element devices belonging to the gas supply apparatus can be densely arranged on the same surface of the base, so that the gas supply apparatus can be scaled down.

Patent Document 1: Japanese Patent No. 5,020,758

However, in a gas supply system which controls the supply of the processing gas into the processing apparatus, if the volume of the pipeline configured to connect the element devices of the gas supply system is large, it takes time to exhaust the processing gas remaining in the pipeline when replacing the processing gas flowing in the pipeline. Therefore, it is difficult to improve throughput in the processing apparatus which performs multiple processes while replacing the processing gases.

Furthermore, when replacing the processing gas at a high speed by opening or closing a valve, if the volume of the pipeline which connects the element devices of the gas supply system is large, the valve is opened before a pressure within the pipeline reaches a required level. In such a case, it is difficult to control the processing gas to have a required pressure.

SUMMARY

In one exemplary embodiment, a gas supply system of supplying a gas into a processing apparatus includes a plurality of element devices which constitute the gas supply system and a base on which the plurality of element devices are disposed. Some of the element devices are disposed on a first surface of the base and the others of the element devices are disposed on a second surface of the base, which is opposite to the first surface of the base.

According to the exemplary embodiments, it is possible to improve the throughput of the processing and the accuracy of the pressure control over the processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A to FIG. 4C are diagrams illustrating an example of a control method for a gas flow rate in a comparative example;

FIG. 18A and FIG. 18B are diagrams illustrating an example of a pressure variation within a processing vessel for each of different pipeline lengths;

FIG. 24 is a table illustrating examples of a gas A used in a process ST35 and a gas B used in a process ST37 in the flowchart of FIG. 22;

DETAILED DESCRIPTION

Figure 1:
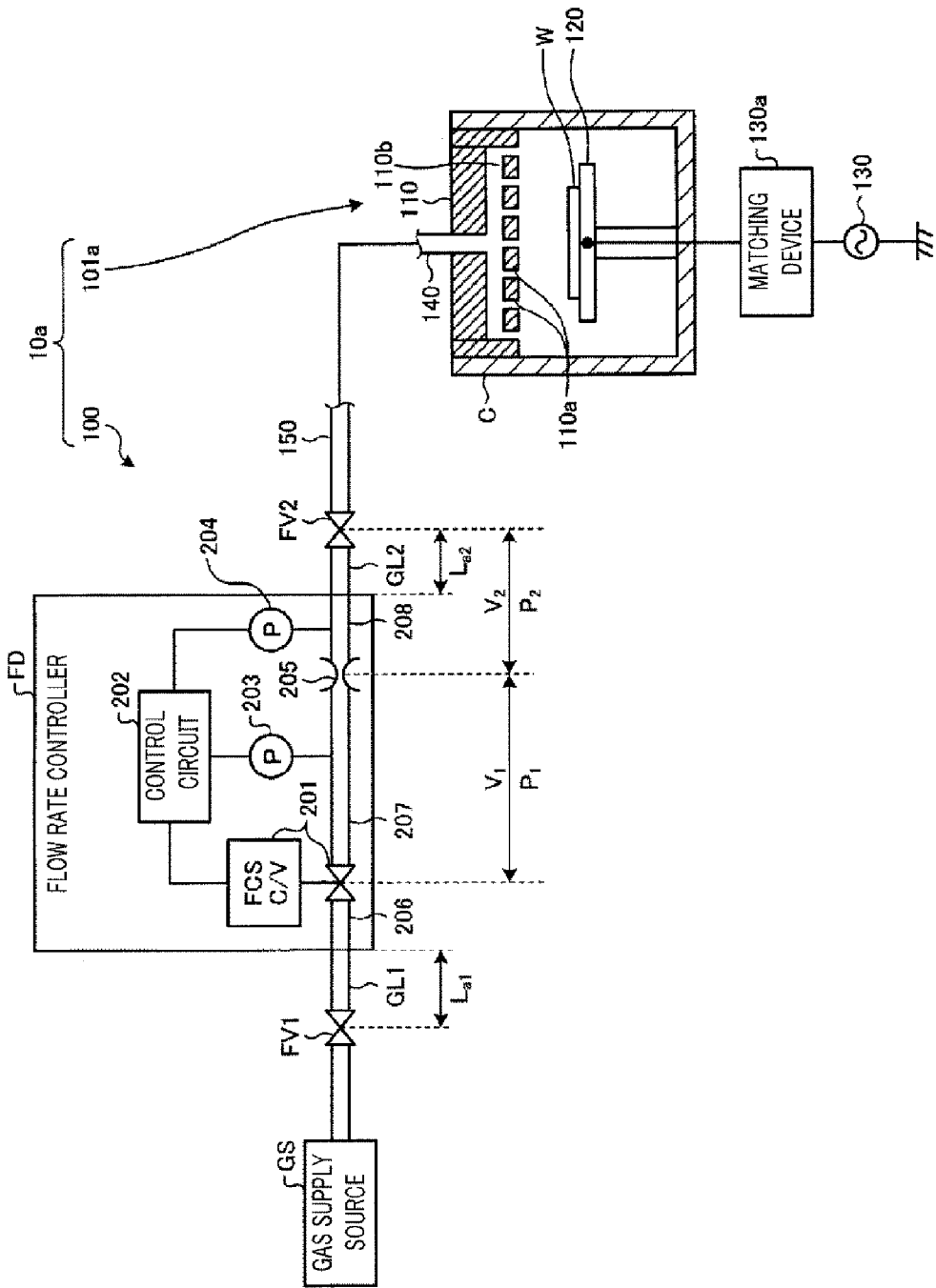
FIG. 1 is a diagram illustrating an example of a processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

[First Exemplary Embodiment]

<Overall Configuration of Processing System>

First, an example of an overall configuration of a processing system 10a according to a first exemplary embodiment will be described with reference to FIG. 1. FIG. 1 is a diagram illustrating an example of the processing system 10a according to the first exemplary embodiment. The processing system 10a includes a gas supply system 100 and a processing apparatus 101a. The gas supply system 100 includes a flow rate controller FD, a primary valve FV1 and a secondary valve FV2, and is configured to control a supply of a gas into the processing apparatus 101a from a gas supply source GS. The flow rate controller FD, the primary valve FV1 and the secondary valve FV2 are examples of multiple element devices which constitute the gas supply system 100. In the present exemplary embodiment, the processing apparatus 101a is configured as, by way of non-limiting example, a capacitively coupled plasma etching apparatus. In the following, the processing apparatus 101a may also be referred to as a reactor unit.

<Configuration Example of Processing Apparatus 101a>

The processing apparatus 101a includes a substantially cylindrical chamber C made of, by way of example, but not limitation, aluminum having an alumite-treated (anodically oxidized) surface. The chamber C is grounded. A mounting table 120 is provided within the chamber C. The mounting table 120 is configured to mount thereon a semiconductor wafer W as an example of a processing target object.

The mounting table 120 is connected via a matching device 130a to a high frequency power supply 130 for exciting plasma. The high frequency power supply 130 is configured to apply a high frequency power having an appropriate frequency of, e.g., 60 MHz for generating plasma within the chamber C to the mounting table 120. The mounting table 120 mounts thereon the semiconductor wafer W and also serves as a lower electrode. The matching device 130a is configured to match a load impedance with an internal (or output) impedance of the high frequency power supply 130. The matching device 130a serves to control the internal impedance of the first high frequency power supply 130 to be apparently matched with the load impedance when the plasma is generated within the chamber C.

A shower head 110 is provided at a ceiling portion of the chamber C. The shower head 110 serves as an upper electrode. The high frequency power from the high frequency power supply 130 is applied to a space between the mounting table 120 and the shower head 110. A gas is introduced into a buffer room 110b formed within the shower head 110 from a gas inlet opening 140 of the shower head 110, and then, is discharged into the chamber C through gas discharge holes 110a formed in a bottom surface of the shower head 110.

The processing apparatus 101a is configured to perform a micro-processing on the semiconductor wafer W with plasma of the required gas supplied into the chamber C. The gas is supplied into the chamber C while being controlled by the flow rate controller FD. In the present exemplary embodiment, the flow rate controller FD may be implemented by, for example, a pressure type flow rate control device (FCS).

<Configuration Example of Flow Rate Controller FD>

The flow rate controller FD is connected to a gas supply line 150 through which a gas is supplied from the gas supply source GS into the processing apparatus 101a. The gas supply line 150 is connected to the gas inlet opening 140 of the processing apparatus 101a. The primary valve FV1 is disposed at an upstream side of the flow rate controller FD (i.e., at the side of the gas supply source GS), and the secondary valve FV2 is provided at a downstream side of the flow rate controller FD (i.e., at the side of the semiconductor device manufacturing apparatus). The primary valve FV1 and the secondary valve FV2 can be controlled to be either fully opened or fully closed.

The flow rate controller FD includes a control valve 201, a control circuit 202 configured to control an opening degree of the control valve 201, a pressure gauge 203, a pressure gauge 204, an orifice 205, a pipeline 206, a pipeline 207 and a pipeline 208. The flow rate controller FD is configured to control a flow rate of the gas supplied into the chamber C through the gas supply line 150 by controlling the opening degree of the control valve 201. An example of the control valve 201 may be, but not limited to, a solenoid-operated metal diaphragm valve.

An upstream side of the primary valve FV1 is connected to the gas supply source GS via a pipeline, and a downstream side of the primary valve FV1 is connected to the pipeline 206 via a pipeline GL1 that connects the flow rate controller FD and the primary valve FV1. Here, the length of the pipeline GL1 is defined as $L_{a1}$. A downstream side of the pipeline 206 is connected to an upstream side of the control valve 201. A downstream side of the control valve 201 is connected to an upstream side of the pipeline 207. A downstream side of the pipeline 207 is connected to an upstream side of the pipeline 208 via the orifice 205. A downstream side of the pipeline 208 is connected to an upstream side of the secondary valve FV2 via a pipeline GL2 that connects the flow rate controller FD and the secondary valve FV2. The length of the pipeline GL2 is defined as $L_{a2}$. Further, a downstream side of the secondary valve FV2 is connected to the gas supply line 150.

Here, a pressure within a flow path of the pipeline 207 is defined as $P_1$ and a volume within the flow path of the pipeline 207 is defined as $V_1$. Further, a pressure within flow paths of the pipeline 208 and the pipeline GL2 is defined as $P_2$ and a total volume within the flow paths of the pipeline 208 and the pipeline GL2 is defined as $V_2$. In the flow rate controller FD, when the pressure $P_1$ within the pipeline 207 and the pressure $P_2$ within the pipeline 208 and the pipeline GL2 are controlled to substantially satisfy a critical expansion pressure condition of $P_1 > 2 \times P_2$, a gas flow rate Q flowing through the orifice 205 is determined only based on the pressure $P_1$ at the upstream side of the orifice 205, as indicated by the following relational expression (1).

$$Q=CP_1 \qquad (1)$$

By controlling the pressure $P_1$ through the control of the control valve 201 based on the above expression (1), the flow rate controller FD controls the gas flow rate Q at the downstream side of the orifice 205 to a required value which satisfies a processing condition. Further, in the above expression (1), C denotes a constant value which relies on a diameter of the orifice 205, a gas temperature, or the like. The pressure $P_1$ and the pressure $P_2$ are measured by the pressure gauge 203 and the pressure gauge 204, respectively.

In performing a process such as etching in this processing apparatus 101a having the above-described configuration, a semiconductor wafer W is carried into the chamber C and is mounted on the mounting table 120. Then, the inside of the chamber C is decompressed to be in a vacuum state. A gas supplied from the gas supply source GS is introduced into the chamber C from the shower head 110 in a shower shape. Then, a preset high frequency power output from the high frequency power supply 130 is applied to the mounting table 120.

Then, the process such as plasma etching is performed on the semiconductor wafer W mounted on the mounting table 120 with the plasma which is generated by ionizing and dissociating the gas introduced in the chamber C with the high frequency power. Upon the completion of the process such as the plasma etching, the semiconductor wafer W is carried out of the chamber C. Here, the processing apparatus 101a is not limited to the aforementioned example configured to perform the process with the plasma, but it may be configured to perform the micro-processing on the semiconductor wafer W through a heat treatment or the like.

<Arrangement of Flow Rate Controller FD and Secondary Valve FV2>

In the gas supply system 100 according to the first exemplary embodiment, some of the multiple element devices constituting the gas supply system 100 are arranged on one surface, i.e., a front surface of the base 212, whereas some other element devices are arranged on the other surface, i.e., a rear surface of the base 212. In the following description, an example arrangement of the multiple element devices constituting the gas supply system 100 will be discussed. In the description, the flow rate controller FD and the secondary valve FV2 are illustrated as examples of the multiple element devices that constitute the gas supply system 100.

Figure 2:
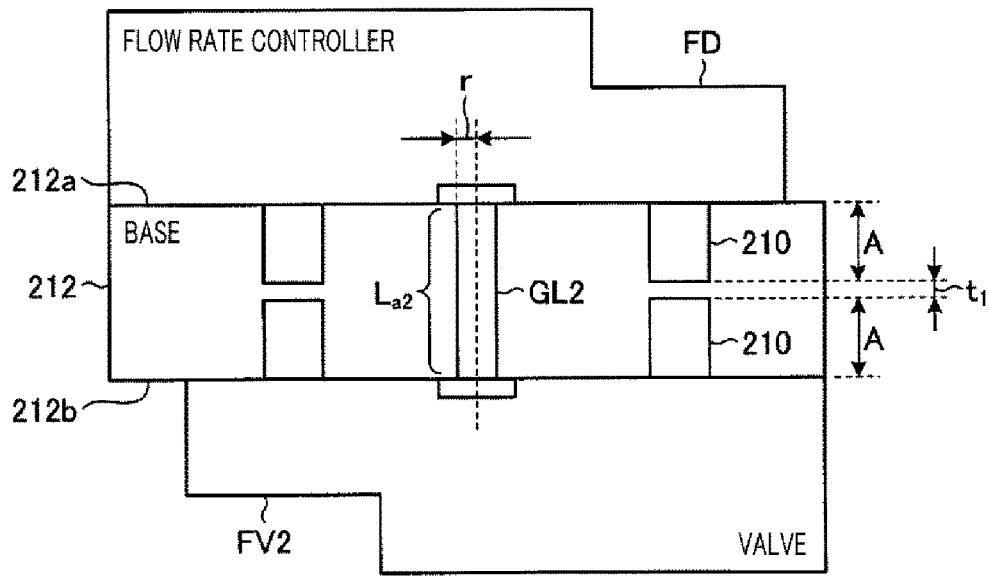
FIG. 2 is a diagram illustrating an example arrangement of a flow rate controller and a secondary valve in the first exemplary embodiment.

FIG. 2 is a diagram illustrating the example arrangement of the flow rate controller FD and the secondary valve FV2 according to the first exemplary embodiment. In the present exemplary embodiment, the flow rate controller FD and the secondary valve FV2 are arranged on different surfaces of the base 212. By way of example, as depicted in FIG. 2, the flow rate controller FD is placed on one surface 212a of the base 212, whereas the secondary valve FV2 is disposed on the other surface 212b of the base 212, which is opposite to the surface 212a of the base 212 where the flow rate controller FD is placed.

Further, the pipeline GL2 configured to connect the flow rate controller FD and the secondary valve FV2 while allowing a gas to flow therein is provided within the base 212 in a straight line shape to penetrate the base 212 in a thickness direction thereof, as shown in FIG. 2.

Here, a volume $V_a$ of the flow path of the pipeline GL2 shown in FIG. 2 may be defined by the following expression (2), for example.

$$V_a=\pi r^2 L_{a2}=\pi r^2(2A+t_1) \qquad (2)$$

In the above expression (2), r denotes a radius of the flow path of the pipeline GL2; A, a depth of screw holes 210 for screwing the flow rate controller FD and the secondary valve FV2 to the base 212; and $t_1$, a distance between the screw holes 210.

For example, assuming that the radius r of the flow path of the pipeline GL2 is 1.5 mm, the depth A of the screw holes 210 is 5 mm and the distance $t_1$ between the screw holes 210 is 1 mm, the volume $V_a$ of the flow path of the pipeline GL2 shown in FIG. 2 is about 0.077 cc.

Figure 3:
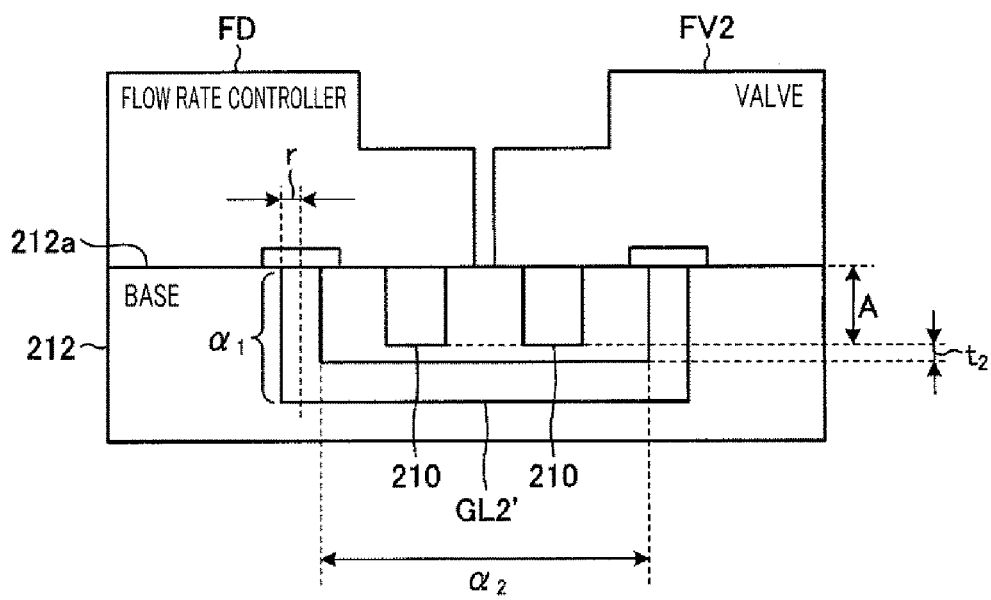
FIG. 3 is a diagram illustrating a conventional arrangement of the flow rate controller and the secondary valve.

Meanwhile, in a conventional gas supply system, multiple element devices that constitute the gas supply system are arranged on the same surface of the base. FIG. 3 is a diagram illustrating a conventional arrangement of the flow rate controller FD and the secondary valve FV2. In case that the multiple element devices constituting the gas supply system are the flow rate controller FD and the secondary valve FV2, for example, both the flow rate controller FD and the secondary valve FV2 are arranged on the single surface 212a of the base 212 in the conventional gas supply system, as illustrated in FIG. 3.

As depicted in FIG. 3, in the conventional gas supply system, since the flow rate controller FD and the secondary valve FV2 are densely arranged on the same surface 212a of the base 212, a pipeline GL2' connecting the flow rate controller FD and the secondary valve FV2 is extended into the base 212 from the surface 212a of the base 212 where the flow rate controller FD and the secondary valve FV2 are arranged, and is also extended back to the surface 212a of the base 212. That is, the pipeline GL2' has a bent shape.

Here, a volume $V_a'$ of a flow path of the pipeline GL2' shown in FIG. 3 may be defined by the following expression (3), for example.

$$V_a'=\pi r^2(2\alpha_1+\alpha_2)=\pi r^2\{2(A+t_2+2r)+\alpha_2\} \qquad (3)$$

In the above expression (3), $\alpha_1$ represents a length of the flow path within the pipeline GL2' in the thickness direction of the base 212; $\alpha_2$, a length of the flow path within the pipeline GL2' in a surface direction of the base 212; and $t_2$, a distance between the screw holes 210 and the pipeline GL2'.

By way of example, assuming that a radius r of the flow path of the pipeline GL2' is 1.5 mm, a depth A of the screw holes 210 is 5 mm and the distance $t_2$ between the screw holes 210 and the pipeline GL2' is 1 mm, and the length $\alpha_2$ of the flow path of the pipeline GL2' in the surface direction of the base 212 is 24 mm, the volume $V_a'$ of the flow path of the pipeline GL2' shown in FIG. 3 becomes about 0.296 cc.

As stated above, according to the present exemplary embodiment, by placing the secondary valve FV2 on the rear surface of the base 212, which is opposite to the surface of the base 212 where the flow rate controller FD is provided and by connecting the flow rate controller FD and the secondary valve FV2 with the straight pipeline GL2 which penetrates the base 212, the length of the pipeline GL2 connecting the flow rate controller FD and the secondary valve FV2 in the gas supply system 100 can be shortened, as compared to the conventional gas supply system where the flow rate controller FD and the secondary valve FV2 are disposed on the same surface of the base 212. Accordingly, in the gas supply system 100 according to the present exemplary embodiment, the volume of the pipeline GL2 connecting the flow rate controller FD and the secondary valve FV2 can be reduced, as compared to the conventional gas supply system.

Further, though FIG. 2 illustrates only the arrangement of the flow rate controller FD and the secondary valve FV2, the flow rate controller FD and the primary valve FV1 are arranged in the same manner. That is, the primary valve FV1 is placed on the rear surface of the base 212, which is opposite to the surface of the base 212 where the flow rate controller FD is disposed, and the flow rate controller FD and the primary valve FV1 are connected with the straight pipeline GL1 that penetrates the base 212.

<Gas Supply Control Method>

Figure 5A:
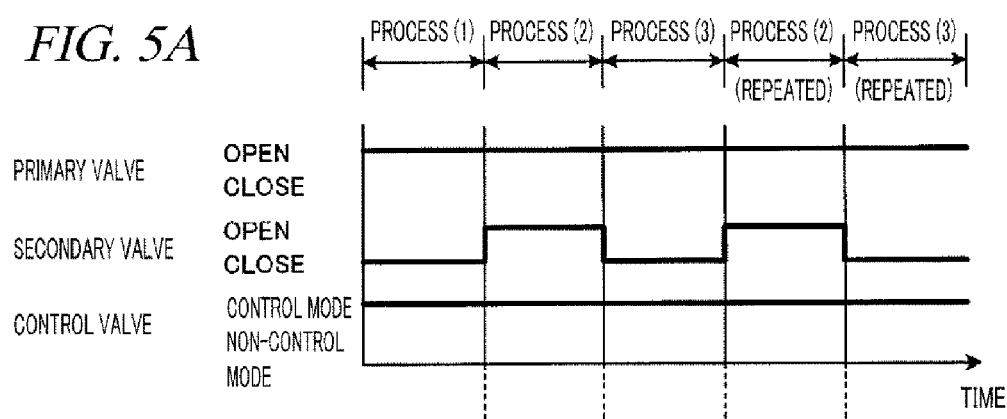
FIG. 5A to FIG. 5C are diagrams illustrating an example of a control method for a gas flow rate according to the first exemplary embodiment.
Figure 5B:
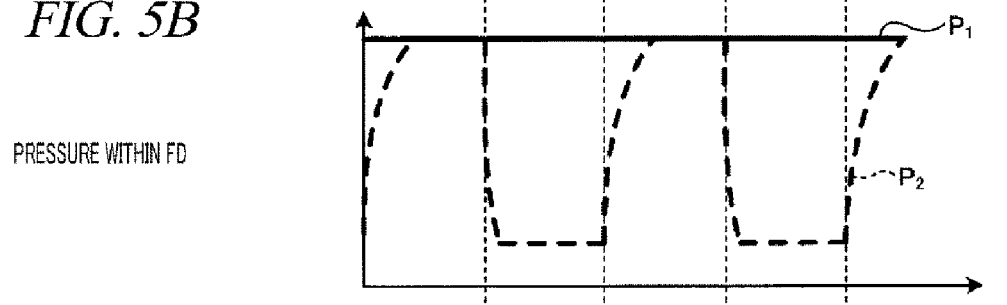
Figure 5C:
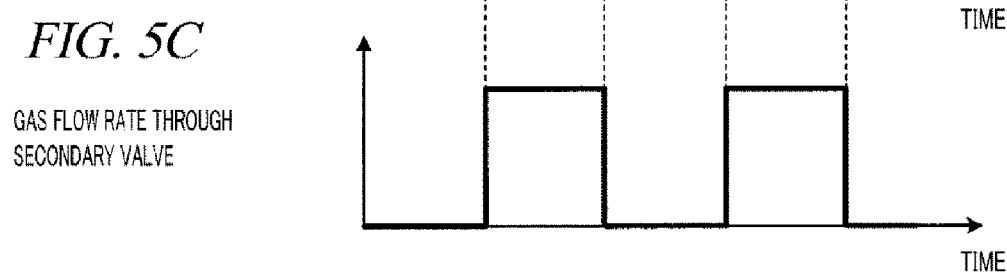

Now, a gas supply control method according to a comparative example will be explained with reference to FIG. 4A to FIG. 4C. Then, a gas supply control method according to the first exemplary embodiment will be described with reference to FIG. 5A to FIG. 5C. FIG. 4A to FIG. 4C are diagrams illustrating an example of the gas supply control method in the comparative example. FIG. 5A to FIG. 5C are diagrams illustrating an example of the gas supply control method according to the first exemplary embodiment.

In FIG. 4A, a horizontal axis indicates time and a vertical axis represents a control state of each of the primary valve FV1, the secondary valve FV2 and the control valve 201. In FIG. 4B, a horizontal axis represents time and a vertical axis indicates pressures $P_1$ and $P_2$ within the flow rate controller FD. In FIG. 4C, a horizontal axis represents time and a vertical axis indicates a flow rate of a gas flowing in the secondary valve FV2.

In the comparative example, a gas supply is controlled by adjusting the opening and the closing of each valve shown in FIG. 4A. Each valve is controlled in the order of process (1)→process (2)→process (3)→process (2)→process (3)→ . . . . The processes (2) and (3) are repeated a preset number of times.

Further, the primary valve FV1 and the secondary valve FV2 can be controlled to be fully opened or fully closed. When the control state of the primary valve FV1 and the secondary valve FV2 are "OPEN," it means that the valves are fully opened. Further, when the control state of the primary valve FV1 and the secondary valve FV2 are "CLOSE," it means that the valves are fully closed. The control valve 201 can be controlled to be fully opened, fully closed or opened to a certain opening degree between the fully opened state and the fully closed state. When the control state of the control valve 201 is "control mode," the opening degree of the control valve 201 is adjusted under the control of the control circuit 202, and a gas having a flow rate according to the opening degree of the control valve 201 is supplied into the processing apparatus 101a. Meanwhile, when the control state of the control valve 201 is "non-control mode (control stop mode)," the control valve 201 is turned into a fully closed state, and the supply of the gas into the processing apparatus 101a is stopped.

Valve states in the individual processes shown in FIG. 4A are elaborated as follows.

(Process (1))

In a process (1), both the primary valve FV1 and the secondary valve FV2 are controlled to be fully closed, and the control over the control valve 201 is stopped, so that the supply of the gas into the processing apparatus 101a is stopped.

(Process (2))

In a process (2), both the primary valve FV1 and the secondary valve FV2 are controlled to be fully opened, and, then, the control valve 201 is turned into the control mode, so that the gas is supplied into the processing apparatus 101a.

(Process (3))

In a process (3), both the primary valve FV1 and the secondary valve FV2 are controlled to be fully closed, and the control over the control valve 201 is then stopped again, so that the supply of the gas into the processing apparatus 101a is stopped.

Further, as for the sequence of the opening/closing operations of the primary valve FV1 and the secondary valve FV2, the primary valve FV1 and the secondary valve FV2 may be opened/closed at the same time, or the primary valve FV1 may be opened upon the lapse of a preset time after the secondary valve FV2 is opened. Further, in the process (2), the control over the control valve 201 is performed after the primary valve FV1 and the secondary valve FV2 are completely opened. That is, upon the lapse of a preset time T after the primary valve FV1 and the secondary valve FV2 are fully opened, the control operation of the control valve 201 is begun. In the present exemplary embodiment, the preset time T may be 200 milliseconds, but not limited thereto.

Subsequently, for the control over each valve in the aforementioned individual processes, the pressures $P_1$ and $P_2$ within the flow rate controller FD shown in FIG. 4B and the flow rate of the gas flowing in the secondary valve FV2 shown in FIG. 4C will be described.

Since the critical expansion pressure condition ($P_1 > 2 \times P_2$) is satisfied before the gas supply into the processing apparatus 101a is stopped, the gas is moved through the orifice 205 between the pipeline 207 and the pipeline 208 to be in an equilibrium state after the gas supply into the processing apparatus 101a is stopped in the process (1). As a result, as depicted in FIG. 4B, the pressure $P_1$ within the pipeline 207 decreases gradually, whereas the pressure $P_2$ within the pipeline 208 increases gradually. Further, in the process (1), since the secondary valve FV2 is controlled to be fully closed, the gas does not flow through the secondary valve FV2 as illustrated in FIG. 4C.

In the process (2), the primary valve FV1 and the secondary valve FV2 are first controlled to be fully opened. Accordingly, the pressures $P_1$ and $P_2$ of the flow rate controller FD are decreased, as depicted in FIG. 4B, and the gas remaining in the pipelines 207, 208 and GL2 flows through the secondary valve FV2, as shown in FIG. 4C. Then, with the lapse of the preset time T, since the control of the control valve 201 within the flow rate controller FD is begun, as depicted in FIG. 4A, the pressure $P_1$ of the flow rate controller FD shown in FIG. 4B is increased, so that the gas is flown through the secondary valve FV2 at a required flow rate.

Then, the pressure $P_1$ within the pipeline 207 and the pressure $P_2$ within the pipeline 208 are controlled constant by the control valve 201, as depicted in FIG. 4B, and the flow rate of the gas passing through the secondary valve FV2 is controlled constant, as shown in FIG. 4C. That is, if the control valve 201 is in the control mode, the flow rate of the gas supplied into the chamber C is regulated to a preset level.

In the process (3), after the primary valve FV1 and the secondary valve FV2 are controlled to be fully closed, the control valve 201 is turned into a fully closed state as well, so that the supply of the gas into the processing apparatus 101a is stopped. Accordingly, the gas is moved between the pipeline 207 and the pipeline 208 through the orifice 205 to be in the equilibrium state. As a result, as shown in FIG. 4B, the pressure $P_1$ of the pipeline 207 is decreased, whereas the pressure $P_2$ of the pipeline 208 is increased. Further, in the process (3), since the secondary valve FV2 is controlled to be fully closed, the gas does not flow through the secondary valve FV2, as depicted in FIG. 4C.

Figure 6:
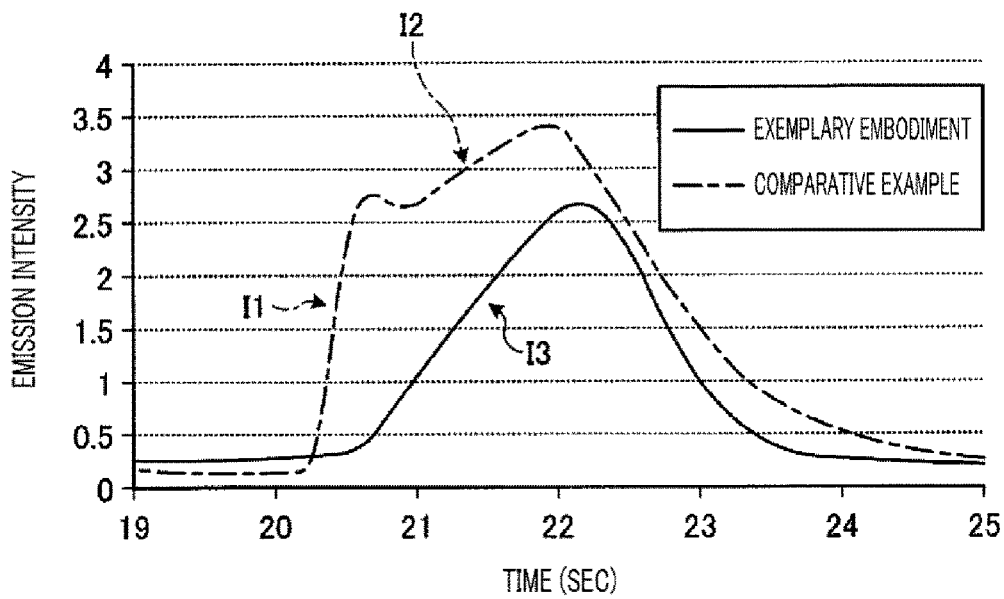
FIG. 6 is a diagram illustrating examples of emission intensity of a gas in the first exemplary embodiment and in the comparative example.

FIG. 6 is a diagram illustrating examples of emission intensity of the gas in the first exemplary embodiment and in the comparative example. A variation in the flow rate of the gas supplied into the chamber C with a lapse of time can be observed based on the emission intensity of the gas within the chamber C. When the emission intensity of the gas within the chamber C increases, the flow rate of the gas is found to be increased, and when the emission intensity of the gas within the chamber C decreases, the flow rate of the gas is found to be decreased.

In the comparative example, as depicted in the process (2) of FIG. 4A, (1) the primary valve FV1 and the secondary valve FV2 are turned into the fully opened states, and, then, (2) the control valve 201 is turned into the control mode. In the comparative example, at the moment the secondary valve FV2 is opened, the gas supply into the processing apparatus 101a is begun. Accordingly, during the preset time T until the control valve 201 is turned into the control mode after the primary valve FV1 and the secondary valve FV2 are controlled to be fully opened, the gas remaining in the pipelines between the primary valve FV1 and the secondary valve FV2 shown in FIG. 4A flows through the secondary valve FV2 and is supplied into the chamber C. If the control of the control valve 201 is begun, the gas, which is controlled to have the preset flow rate, is supplied into the chamber C through the secondary valve FV2. As stated above, in the comparative example, by the two-stage control of the stages (1) and (2) in the process (2), the flow rate of the gas supplied into the chamber C is controlled to the preset flow rate after two-step increase of I1 and I2 of FIG. 6 take place.

A height and a gradient of the increment in the flow rate of the gas at the first-step increase I1 before the control of the control valve 201 is begun shown in FIG. 6 are determined by the gas remaining within the flow rate controller FD. The state of this residual gas may be differed depending on a state of usage of the flow rate controller FD immediately before the current gas supply is begun or depending on an object variance of the flow rate controller FD. Thus, it is difficult to completely manage the increment of the flow rate of the gas at the first-step increase of I1. Accordingly, the managing of a waveform of the emission intensity at the first-step increase of I1, that is, the controlling the flow rate of the gas at the first-step increase I1 is more difficult than that at the second-step increase I2.

As one way to suppress the first-step increase I1 in the gas flow rate, there may be a method of reducing a variation of the pressure $P_1$ within the pipeline 207 for a time period during which the gas supply into the processing apparatus 101a is stopped. One of various manners to implement such a method is the gas supply control method according to the present exemplary embodiment.

In the gas supply control method according to the present exemplary embodiment, the primary valve FV1 is controlled to be fully opened, and the flow rate of the gas is controlled through an opening/closing operation of the secondary valve FV2. Accordingly, when supplying the gas into the chamber C, it is possible to suppress a rapid change within the chamber C such as the aforementioned two-step increase of I1 and I2 in the flow rate of the gas supplied into the chamber C.

To elaborate, in the gas supply control method according to the present exemplary embodiment, the individual valves are controlled as depicted in FIG. 5A. Valve states in individual processes are elaborated as follows.

(Process (1))

In a process (1), the primary valve FV1 is controlled to be fully opened, and the control valve 201 is in the control mode. Further, the secondary valve FV2 is controlled to be fully closed, so that the supply of the gas into the processing apparatus 101a is stopped.

(Process (2))

In a process (2), the primary valve FV1 is continuously controlled to be fully opened, and the control valve 201 is also maintained to be in the control mode. Meanwhile, the secondary valve FV2 is controlled to be fully opened, so that the gas is supplied into the processing apparatus 101a.

(Process (3))

In a process (3), the primary valve FV1 is still controlled to be fully opened, and the control valve 201 is still maintained to be in the control mode. The secondary valve FV2 is controlled to be fully closed, so that the supply of the gas into the processing apparatus 101a is stopped.

For the control over the valves in the aforementioned individual processes, the pressures $P_1$ and $P_2$ within the flow rate controller FD shown in FIG. 5B and the flow rate of the gas flowing through the secondary valve FV2 shown in FIG. 5C will be described. In the present exemplary embodiment, in all of the processes, the primary valve FV1 is continuously controlled to be fully opened and the control valve 201 is maintained to be in the control mode. Accordingly, the pressure $P_1$ within the pipeline 207 is maintained substantially constant.

Furthermore, in the present exemplary embodiment, the pressure $P_2$ within the pipeline 208 and the pipeline GL2 and the flow rate of the gas flowing through the secondary valve FV2 vary depending on the opening/closing operation of the secondary valve FV2. That is, in the process (1) of the present exemplary embodiment shown in FIG. 5A, since the secondary valve FV2 is closed, the pressure $P_2$ within the pipeline 208 and the pipeline GL2 increases as shown in FIG. 5B. If the pressure $P_2$ reaches the same pressure as the pressure $P_1$ within the pipeline 207, the pressure $P_2$ is maintained at that pressure level. Further, in the process (1), since the secondary valve FV2 is controlled to be fully closed, the gas does not flow through the secondary valve FV2 as depicted in FIG. 5C.

In the process (2), the secondary valve FV2 is controlled to be fully opened. Accordingly, the pressure $P_2$ within the pipeline 208 and the pipeline GL2 is decreased to be maintained at a preset pressure, as shown in FIG. 5B. Further, as depicted in FIG. 5C, the gas having a preset flow rate is flown through the secondary valve FV2. In the process (3), the secondary valve FV2 is controlled to be fully closed, and the pressure $P_2$ within the pipeline 208 and the pipeline GL2 is increased, as shown in FIG. 5B. If the pressure $P_2$ reaches the same pressure as the pressure $P_1$ within the pipeline 207, the pressure $P_2$ is maintained at that pressure level. In the process (3), since the secondary valve FV2 is controlled to be fully closed, the gas does not flow through the secondary valve FV2, as depicted in FIG. 5C.

As stated above, in the present exemplary embodiment, the primary valve FV1 is continuously controlled to be fully opened, and the control valve 201 is continuously maintained to be in the control mode. Accordingly, uncontrolled gas does not remain in the flow rate controller FD, and the control of the gas flow rate followed by the opening/closing operation of the secondary valve FV2 is enabled. Therefore, the flow rate of the gas flowing through the secondary valve FV2 is maintained substantially constant according to the opening/closing of the secondary valve FV2, so that the gas is supplied into the chamber C at the controlled flow rate.

As stated above, in the gas supply control method according to the present exemplary embodiment, the primary valve FV1 is always controlled to be fully opened, and the control valve 201 is always maintained to be in the control mode. Therefore, when starting the supply of the gas into the processing apparatus 101a while controlling the secondary valve FV2 to be fully opened, a gas that exists at the downstream side of the orifice 205 having a reduced conductance is allowed to be supplied into the chamber C without passing through the orifice 205. Accordingly, when the supply of the gas into the processing apparatus 101 is started, the gas is immediately supplied into the chamber C, so that it is possible to suppress the two-step increase in the gas flow rate which has occurred in the comparative example.

In the above-described gas supply control method, however, the pressure $P_1$ within the pipeline 207 and the pressure $P_2$ within the pipeline 208 and the pipeline GL2 may be varied. By way of example, if the opening and closing of the secondary valve FV2 is repeated at a very short cycle, the pressure $P_1$ within the pipeline 207 and the pressure $P_2$ within the pipeline 208 and the pipeline GL2 do not reach the equilibrium state. As a result, the two-step increase may occur.

To solve this problem, in the present exemplary embodiment, a volume ratio $V_1/V_2$ between the volume $V_1$ of the pipeline 207 and the total volume $V_2$ of the pipeline 208 and the pipeline GL2 is optimized in the flow rate controller FD configured to perform the above-described gas supply control method. By performing the gas supply control method of the present exemplary embodiment with the flow rate controller FD in which the volume ratio $V_1/V_2$ between the volumes $V_1$ and $V_2$ is optimized, a two-step increase in the gas flow rate caused by the existence of the residual gas can be completely avoided. Below, the optimization of the volume ratio $V_1/V_2$ between the volumes $V_1$ and $V_2$ will be explained.

<Optimization of Volume Ratio of Gas Supply Line>

In the present exemplary embodiment, the volume ratio $V_1/V_2$ between the volume $V_1$ of the pipeline 207 and the total volume $V_2$ of the pipeline 208 and the pipeline GL2 is optimized by changing the arrangement of the control valve 201, the orifice 205 and the secondary valve FV2 within the flow rate controller FD. To elaborate, the arrangement of the control valve 201 and the secondary valve FV2 is changed such that the volume $V_1$ of the pipeline 207 becomes equal to or larger than nine (9) times the total volume $V_2$ of the pipeline 208 and the pipeline GL2. Further, in the following description, a flow rate controller FD having a configuration in which the volume ratio $V_1/V_2$ is 3/2 is used as a comparative example.

Figure 7:
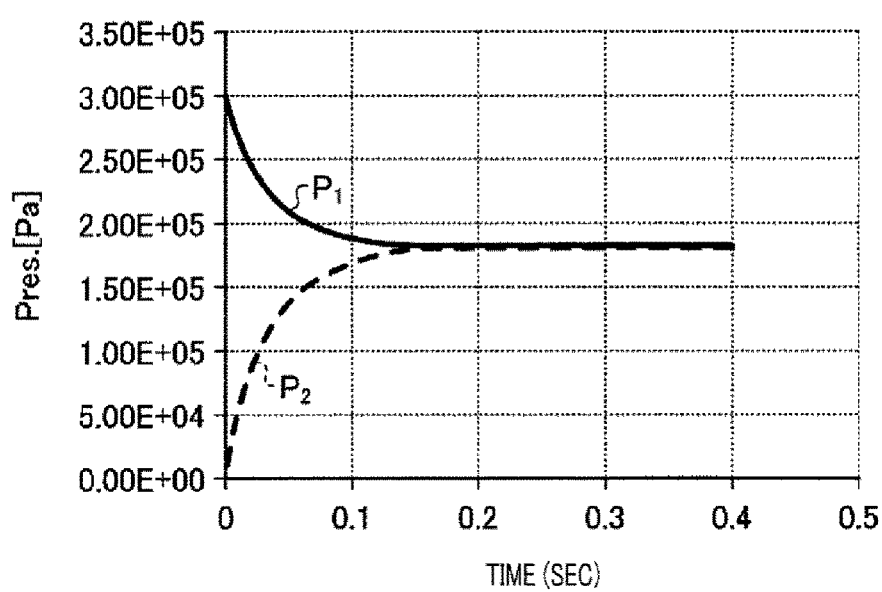
FIG. 7 is a diagram illustrating an example of a pressure variation of a pipeline in the vicinity of an orifice in the comparative example.

For example, under the condition that the pressure $P_1$ within the pipeline 207 and the pressure $P_2$ within the pipeline 208 and the pipeline GL2 substantially satisfy the critical expansion pressure condition ($P_1 > 2 \times P_2$), it is assumed that the volume ratio $V_1/V_2$ between the volume $V_1$ of the pipeline 207 and the total volume $V_2$ of the pipeline 208 and the pipeline GL2 is set to be 3/2. In this case, a variation of the pressure $P_1$ within the pipeline 207 and a variation of the pressure $P_2$ within the pipeline 208 and the pipeline GL2 after the gas supply into the processing apparatus 101a is stopped, i.e., after the control valve 201 and the secondary valve FV2 are controlled to be fully closed are as illustrated in FIG. 7, for example. FIG. 7 is a diagram showing an example of a pressure variation within the pipelines in the vicinity of the orifice 205 in the comparative example. As can be seen from FIG. 7, the variation of the pressure $P_1$ within the pipeline 207 is large and it takes a long time until it is stabilized. As a result, a peak of the gas corresponding to the varied pressure $P_1$ is generated when starting and stopping the gas supply into the processing apparatus 101a, so that it is difficult to control the flow rate of the gas. Further, when changing the flow rate of the gas, it takes a long time until the pressure $P_1$ is stabilized.

Figure 8:
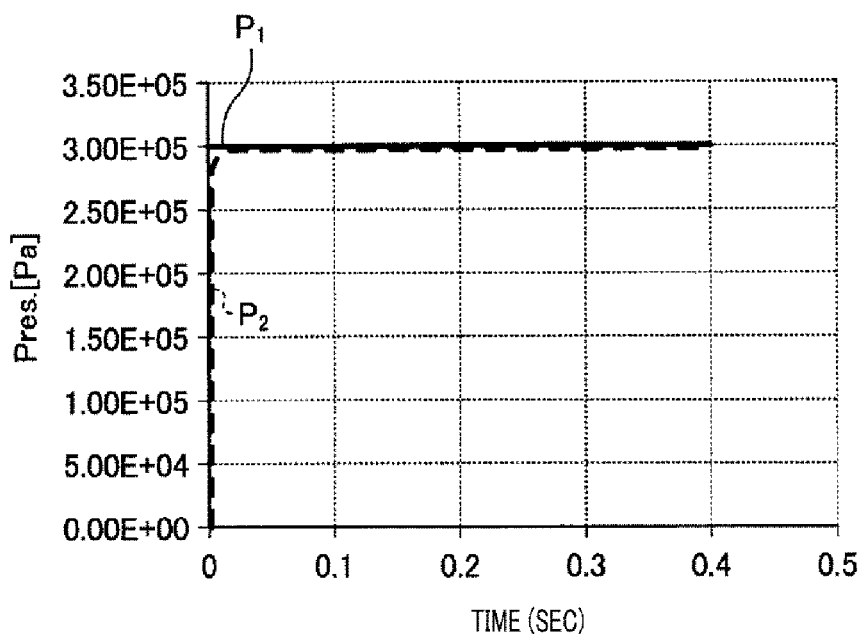
FIG. 8 is a diagram illustrating an example of the pressure variation of the pipeline in the vicinity of the orifice in the first exemplary embodiment.

Meanwhile, under the condition that the pressure $P_1$ within the pipeline 207 and the pressure $P_2$ within the pipeline 208 and the pipeline GL2 substantially satisfy the critical expansion pressure condition ($P_1 > 2 \times P_2$), it is assumed that the volume ratio $V_1/V_2$ between the volume $V_1$ of the pipeline 207 and the total volume $V_2$ of the pipeline 208 and the pipeline GL2 is set to be 90/1. In this case, a variation of the pressure $P_1$ within the pipeline 207 and a variation of the pressure $P_2$ within the pipeline 208 and the pipeline GL2 after the gas supply into the processing apparatus 101a is stopped, i.e., after the control valve 201 and the secondary valve FV2 are controlled to be fully closed are as illustrated in FIG. 8, for example. FIG. 8 is a diagram illustrating an example of the pressure variation within the pipelines in the vicinity of the orifice 205 in the first exemplary embodiment. As can be seen from FIG. 8, the pressure $P_1$ within the pipeline 207 hardly fluctuates and is rapidly stabilized. This indicates that the time required until the pressure $P_1$ is stabilized can be shortened when changing the flow rate of the gas into the processing apparatus 101a.

A curve 13 of the emission intensity in the present exemplary embodiment shown in FIG. 6 is obtained by using the flow rate controller FD in which the volume ratio $V_1/V_2$ between the volume $V_1$ of the pipeline 207 and the total volume $V_2$ of the pipeline 208 and the pipeline GL2 is set to be 90/1. By setting the volume ratio $V_1/V_2$ between the volume $V_1$ of the pipeline 207 and the total volume $V_2$ of the pipeline 208 and the pipeline GL2 to 90/1, the time required to stabilize the pressure $P_1$ can be shortened. Accordingly, after the gas supply into the processing apparatus 101a is begun, the gas can be smoothly supplied into the chamber C. Therefore, the two-step increase in the gas flow rate that has occurred in the comparative example shown in FIG. 6 does not occur.

<Pressure $P_1$ in Equilibrium State>

Figure 9:
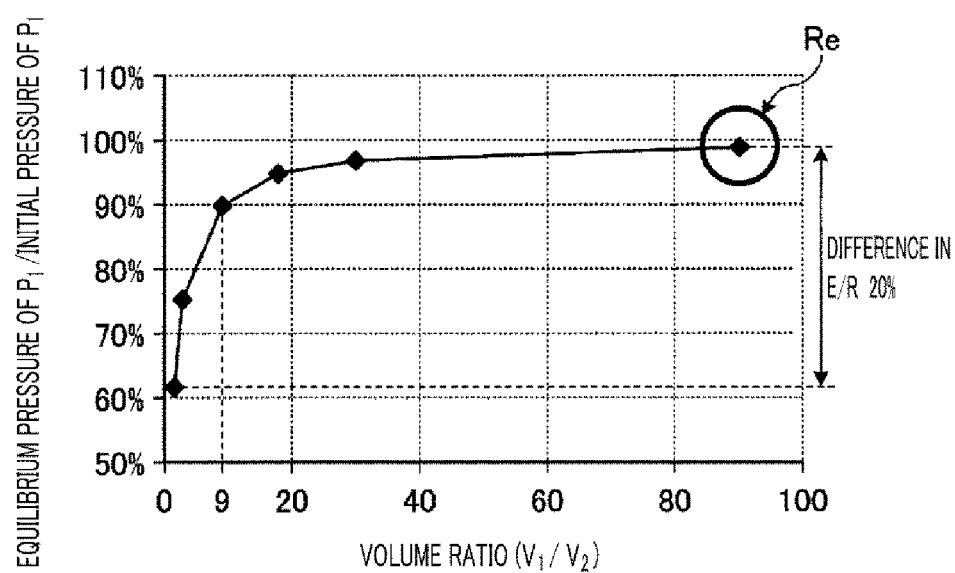
FIG. 9 is a diagram illustrating an example of a relationship between a volume ratio of the pipelines in the vicinity of the orifice and an equilibrium pressure in the first exemplary embodiment.

FIG. 9 is a diagram illustrating an example of a relationship between the volume ratio between the pipelines in the vicinity of the orifice 205 and an equilibrium pressure in the first exemplary embodiment. Plotted in FIG. 9 is a ratio of the equilibrium pressure to the initial pressure of the pressure $P_1$ within the pipeline 207 when varying the volume ratio $V_1/V_2$ between the volume $V_1$ of the pipeline 207 and the total volume $V_2$ of the pipeline 208 and the pipeline GL2. As stated above, when the volume ratio $V_1/V_2$ between the volume $V_1$ of the pipeline 207 and the total volume $V_2$ of the pipeline 208 and the pipeline GL2 is set to be 90/1, the ratio of the equilibrium pressure to the initial pressure of the pressure $P_1$ has a value close to about 100%, as indicated by Re of FIG. 9. Examples of specific values plotted on the graph of FIG. 9 are as follows. The ratio of the equilibrium pressure to the initial pressure of the pressure $P_1$ is 62% when the volume ratio $V_1/V_2$ is 1.5; 75%, when the volume ratio $V_1/V_2$ is 3.0; 90%, when the volume ratio $V_1/V_2$ is 9.0; 95%, when the volume ratio $V_1/V_2$ is 18.0; 97%, when the volume ratio $V_1/V_2$ is 30.0; and 99%, when the volume ratio $V_1/V_2$ is 90.0.

In case that an etching process is performed within the chamber C, a variation between an etching rate E/R when the volume ratio $V_1/V_2$ is set to be 90/1 and an etching rate E/R when the volume ratio $V_1/V_2$ is set to be 3/2 is 20%.

It is desirable that the volume ratio $V_1/V_2$ is set to be 90/1 and such a rising waveform of the two-step increase of I1 and I2, as illustrated in the comparative example of FIG. 6, is not observed. To this end, in order to control the variation of the etching rate E/R to be within 5% in case that the volume ratio $V_1/V_2$ is set to be 90/1, it is desirable to set the ratio of the equilibrium pressure to the initial pressure of the pressure $P_1$ to be within a range from 90% to 100%. That is, the volume ratio $V_1/V_2$ between the volume $V_1$ of the pipeline 207 and the total volume $V_2$ of the pipeline 208 and the pipeline GL2 needs to be set to be equal to or larger than 9/1.

Figure 10:
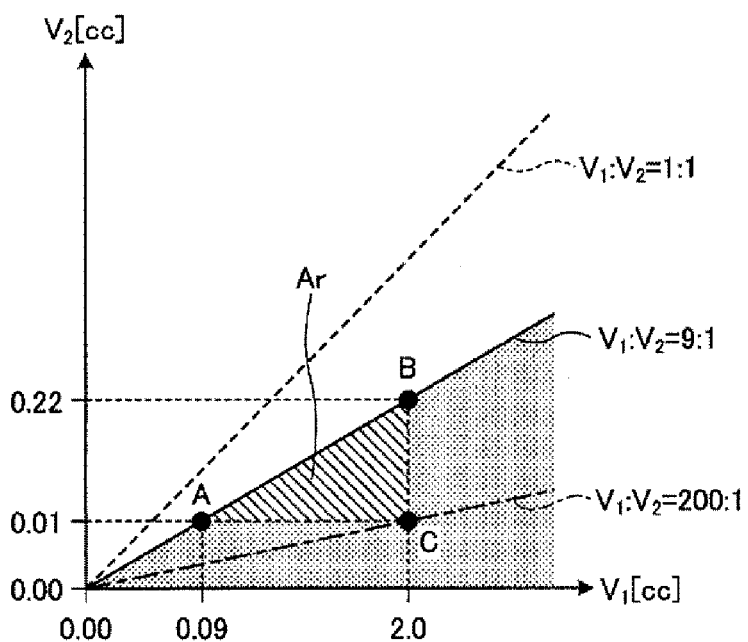
FIG. 10 is a diagram illustrating an example of an appropriate range for the volume ratio of the pipeline in the vicinity of the orifice in the first exemplary embodiment.

That is, the volumes $V_1$ and $V_2$ need to be set such that the volume ratio $V_1:V_2$ shown in FIG. 10 falls within ranges (dotted and dashed ranges in FIG. 10) where the volume ratio $V_1:V_2$ is equal to or larger than 9:1. Here, in order to set the volume ratio $V_1/V_2$ between the volume $V_1$ of the pipeline 207 and the total volume $V_2$ of the pipeline 208 and the pipeline GL2 to be equal to or larger than 9/1, it may be considered to set the volume $V_1$ of the pipeline 207 to be larger or to set the total volume $V_2$ of the pipeline 208 and the pipeline GL2 to be smaller. If the volume $V_1$ of the pipeline 207 is increased, however, it may be difficult to scale down the flow rate controller FD. Furthermore, if the volume $V_1$ of the pipeline 207 is increased, the waste amount of the gas may be increased when removing the gas remaining within the pipeline 207 in order to perform a process while changing the gas supplied into the processing apparatus 101a.

Thus, from the view point of scaling down the apparatus and reducing the waste amount of the gas, it is desirable to set the total volume $V_2$ of the pipeline 208 and the pipeline GL2 to be smaller in order to set the volume ratio $V_1/V_2$ between the volume $V_1$ of the pipeline 207 and the total volume $V_2$ of the pipeline 208 and the pipeline GL2 to be equal to or larger than 9/1. If, however, the flow rate controller FD and the secondary valve FV2 are placed on the same surface of the base 212 as in the conventional gas supply system shown in FIG. 3, the length of the pipeline GL2' connecting the flow rate controller FD and the secondary valve FV2 is lengthened. Though the total volume $V_2$ of the pipeline 208 and the pipeline GL2' can be reduced if the pipeline GL2' is narrowed, there is a limit in narrowing the pipeline GL2' to such extent in terms of fabrication thereof. Thus, in the conventional gas supply system in which the flow rate controller FD and the secondary valve FV2 are placed on the same surface of the base 212, it is difficult to set the total volume $V_2$ of the pipeline 208 and the pipeline GL2' to be small.

On the contrary, in the gas supply system 100 according to the present exemplary embodiment, the secondary valve FV2 is placed on the rear surface of the base 212, which is opposite to the surface of the base 212 where the flow rate controller FD is provided, and the flow rate controller FD and the secondary valve FV2 are connected with the straight pipeline GL2 which penetrates the base 212, as shown in FIG. 2, for example. With this configuration, as compared to the conventional gas supply system, the pipeline GL2 connecting the flow rate controller FD and the secondary valve FV2 can be shortened, and the volume of the pipeline GL2 connecting the flow rate controller FD and the secondary valve FV2 can be reduced. Therefore, in the gas supply system 100 according to the present exemplary embodiment, the volume ratio $V_1/V_2$ between the volume $V_1$ of the pipeline 207 and the total volume $V_2$ of the pipeline 208 and the pipeline GL2 can be easily set to be equal to or larger than 9/1. Furthermore, since the volume $V_1$ of the pipeline 207 and the total volume $V_2$ of the pipeline 208 and the pipeline GL2 can be reduced, the waste amount of the gas when changing the gas for a subsequent process can be reduced.

Further, in consideration of the thickness of the base 212 to which the flow rate controller FD and the secondary valve FV2 are mounted and limitation in physical process of the pipeline 208 within the flow rate controller FD, it is desirable to set the volume $V_1$ of the pipeline 207 and the total volume $V_2$ of the pipeline 208 and the pipeline GL2 such that the volume ratio $V_1:V_2$ becomes equal to or smaller than 200:1. Actually, it is desirable to set the volumes $V_1$ and $V_2$ to be within a range of a region Ar shown in FIG. 10 such that the volume $V_2$ falls within the range from 0.01 cc to 0.2 cc when the volume $V_1$ is in the range from 0.09 cc to 2.0 cc.

As described above, according to the first exemplary embodiment, the gas supply and the stop of the gas supply into the chamber C is controlled through the opening/closing operations of the secondary valve FV2 provided at the downstream of the orifice 205 within the flow rate controller FD. At this time, to reduce the pressure variation caused by the unique structure of the flow rate controller FD when stopping the gas supply, the volume $V_2$ of the pipelines from the orifice 205 to the secondary valve FV2 is set to be smaller than the volume $V_1$ of the pipeline 207 from the control valve 201 to the orifice 205 by at least one digit number.

Accordingly, the flow rate of the gas supplied into the chamber C can be rapidly increased up to the preset flow rate by using the flow rate controller FD. According to the present exemplary embodiment, by improving responsiveness of the gas as described above, it is possible to exchange the gases at a high speed. That is, the gas supply control method with the flow rate controller FD according to the present exemplary embodiment is advantageous in the process (gas pulse) in which the gas supply and the stop of the gas supply are repeated at a high speed.

Moreover, in the present exemplary embodiment, since the responsiveness of the gas is improved, the time required to stabilize the flow rate of the gas within the chamber C can be shortened. Thus, the throughput of the process can be improved.

Figure 11:
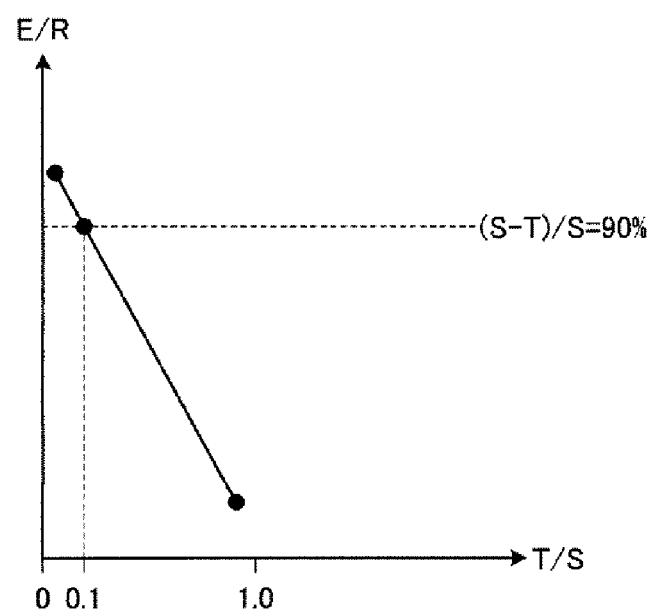
FIG. 11 is a diagram illustrating an example of a relationship between a preset time T and an etching rate in the first exemplary embodiment.

Here, if the preset time T shown in FIG. 4A is lengthened, the flow rate of the gas supplied into the chamber C can be stabilized. If the preset time T is too long, however, the time during which the gas is actually supplied in a valve opening time S is shortened. As a result, if the preset time T is lengthened, the etching rate is decreased. FIG. 11 is a diagram illustrating an example of a relationship between the preset time T and the etching rate in the first exemplary embodiment. A horizontal axis in FIG. 11 represents a ratio T/S of the preset time T to the time S during which the valves are controlled to be fully opened in the process (2). A vertical axis of FIG. 11 indicates the etching rate E/R with respect to the ratio T/S.

As can be seen from FIG. 11, the etching rate decreases as the preset time T increases. If a ratio (S−T)/S is smaller than 90%, i.e., if the ratio T/S is larger than 0.1, the decrement of the etching rate becomes non-negligible. Thus, it is desirable that the preset time T is equal to or less than 1/10 of the time S during which the valves are controlled to be fully opened in the process (2).

Moreover, in the present exemplary embodiment, after the gas supply is begun under the control of the secondary valve FV2, the flow rate of the gas supplied into the chamber C can be stabilized rapidly to a required flow rate. Thus, by setting the matching device 130a to be in a matching position after the flow rate stabilization in advance, a reflection wave of the high frequency power output from the high frequency power supply 130 can be suppressed, so that the process stability in the processing apparatus 101a can be improved.

Furthermore, in the present exemplary embodiment, there does not occur such a variation of the flow rate of the gas as observed in the comparative example, which is difficult to control. Therefore, the non-uniformity in the gas supply into the chamber C caused by the object variance of the flow rate controller FD or the object variance of the processing apparatus 101a can be suppressed, so that the processing in the processing apparatus 101a can be performed stably.

<Rapid Alternating Process>

Figure 12:
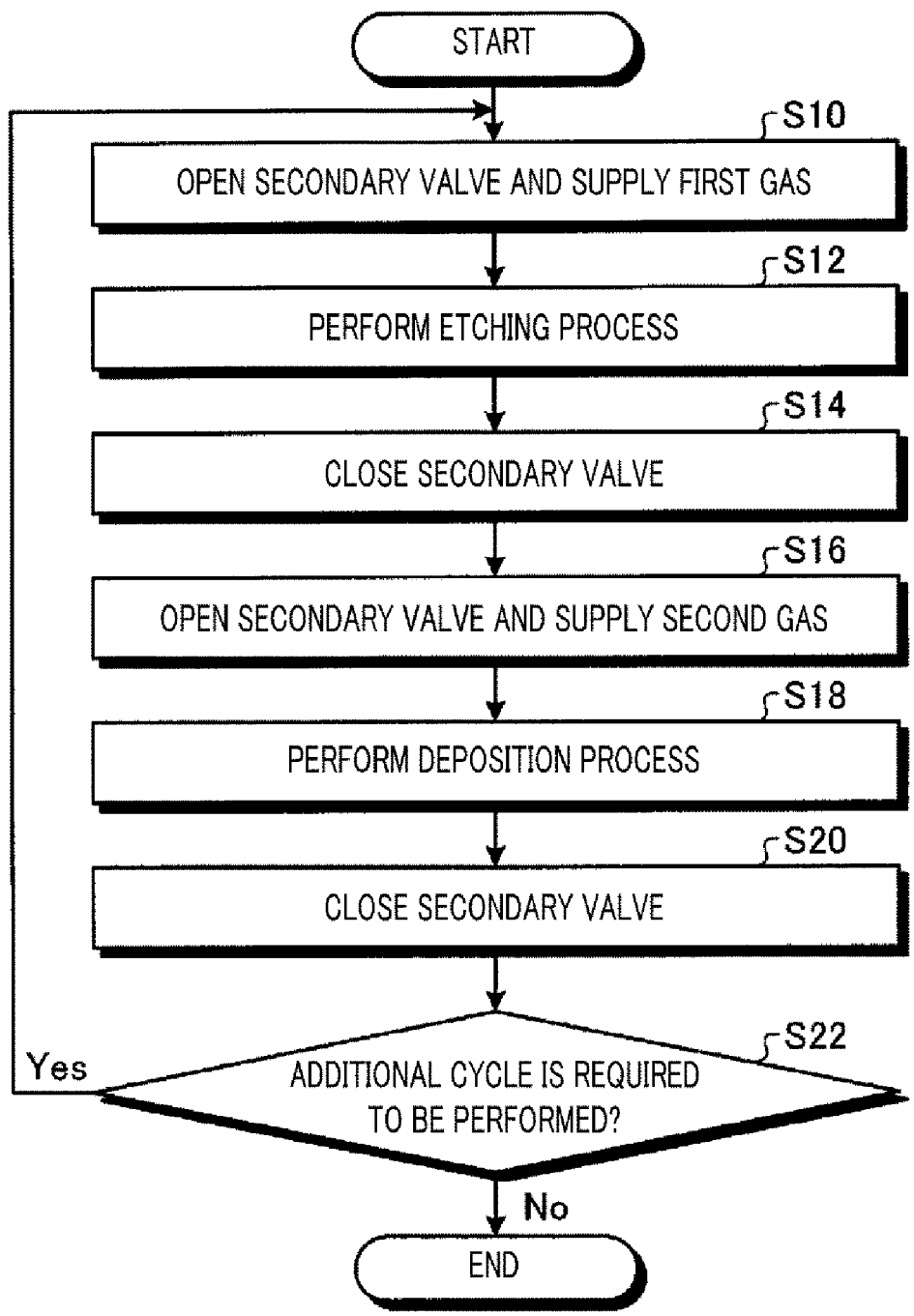
FIG. 12 is a flowchart for describing a rapid alternating process in which a gas supply control method according to the first exemplary embodiment is performed.

Further, as an example of the aforementioned process in which the gas supply and the stop of the gas supply are repeated at a high speed, a rapid alternating process will be briefly explained with reference to FIG. 12. FIG. 12 is a flowchart illustrating an example of the rapid alternating process in which the gas supply control method of the first exemplary embodiment is performed. In the rapid alternating process in FIG. 12 in which the gas supply control method of the present exemplary embodiment is performed, an etching process and a deposition process are performed alternately and rapidly. Here, however, the type of the processes involved in the rapid alternating process is not limited to the mentioned examples. Further, when the rapid alternating process is being performed, the primary valve FV1 is always maintained fully opened, and the control valve 201 is always kept to be in the control mode (under control).

If the rapid alternating process shown in FIG. 12 is begun, the secondary valve FV2 is controlled to be fully opened, and a first gas is supplied (process S10). Subsequently, the high frequency power is applied, and the etching process is performed with the first gas (process S12). Then, the secondary valve FV2 is controlled to be fully closed (process S14).

Subsequently, the secondary valve FV2 is controlled to be fully opened, and a second gas is supplied (process S16). Thereafter, the high frequency power is applied, and the deposition process is performed with the second gas (process S18). Then, the secondary valve FV2 is controlled to be fully closed (process S20).

Afterwards, it is determined whether the cycle of the rapid alternating process needs to be performed additionally (process S22). If It is determined that one more cycle of the rapid alternating process needs to be performed (process S22: Yes), the process returns back to the process S10, and the processes S10 to S22 are repeated. On the other hand, if it is determined that the cycle of the rapid alternating process is not required to be performed any more (process S22: No), the rapid alternating process is finished.

According to the rapid alternating process of the present exemplary embodiment, since the gas having the preset flow rate can be supplied into the chamber C promptly through the control of the opening/closing operation of the secondary valve FV2, the process can be performed efficiently. Further, it is not necessary to conduct the control in consideration of a time that is required for the gas to reach the chamber C. Thus, as stated above, the gas supply control method of the present exemplary embodiment in which the responsiveness of the gas is improved has many advantages in the rapid alternating process in which the gas supply and the stop of the gas supply are repeated at a high speed.

Here, however, an allowable range of the preset time T in the process (2) shown in FIG. 4A with respect to the time S during which the valves are controlled to be fully opened need to be considered. As depicted in FIG. 11, as the preset time T increases (as the ratio T/S increases), the etching rate E/R decreases. If the ratio (S−T)/S is smaller than 90%, that is, if the ratio T/S is larger than 0.1, the decrement of the etching rate becomes non-negligible. Thus, it is desirable that the preset time T is equal to or less than 1/10 of the time S during which the valves are controlled to be fully opened in the process (2).

[Second Exemplary Embodiment]

<Configuration of Gas Supply System GP1>

Figure 13:
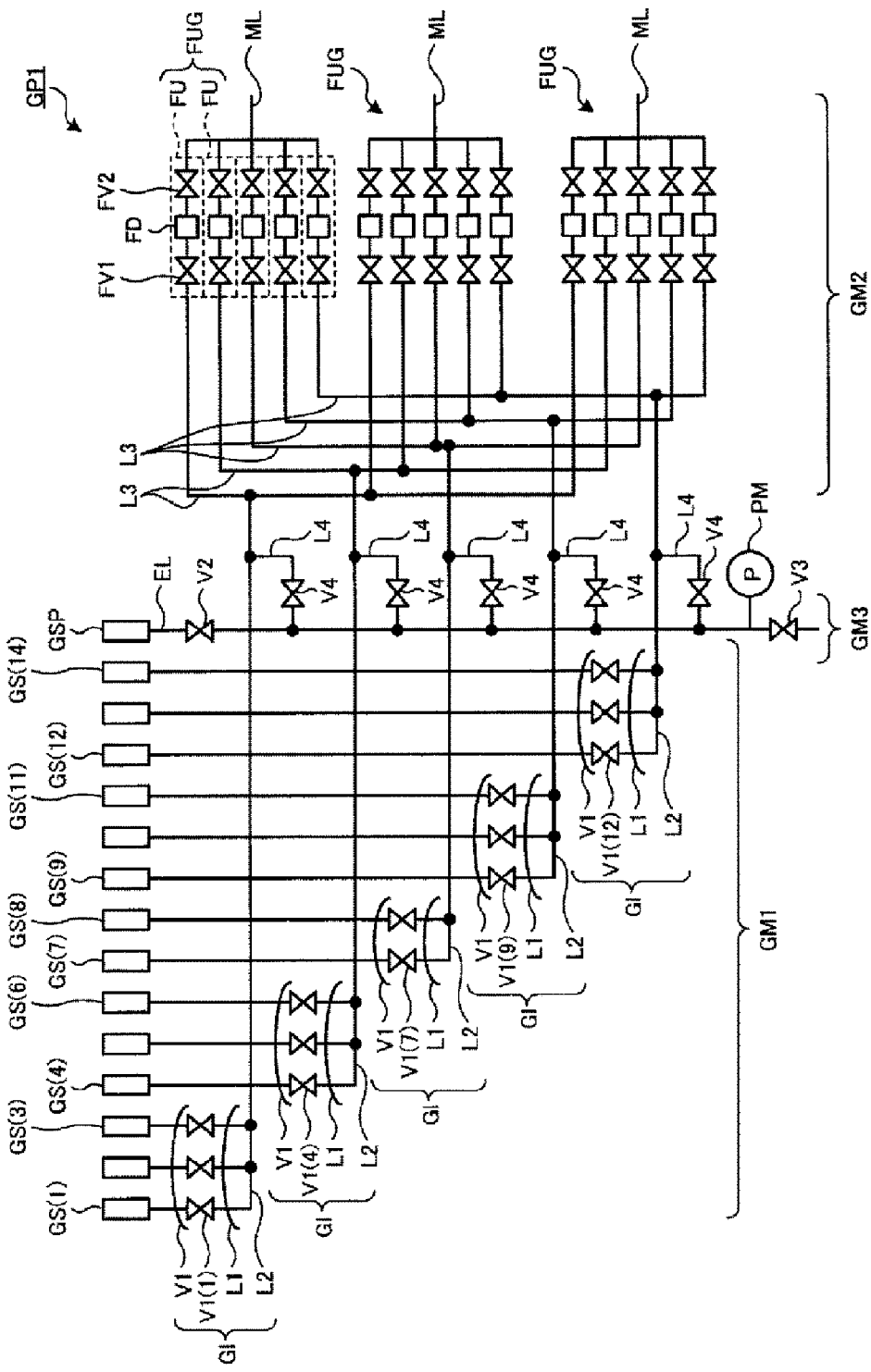
FIG. 13 is a diagram illustrating an example of a gas supply system according to a second exemplary embodiment.

Now, a second exemplary embodiment will be explained. FIG. 13 is a diagram illustrating an example of a gas supply system GP1 according to the second exemplary embodiment. The gas supply system GP1 shown in FIG. 13 includes a first device GM1, a second device GM2 and a third device GM3.

The first device GM1 includes a plurality of integral units GI. In the present exemplary embodiment, the first device GM1 includes five (5) integral units GI. Here, however, the number of the integral units is not limited thereto. The first device GM1 is configured to supply gases selected from the respective integral units GI from individual pipelines.

The first device GM1 includes multiple pipelines L1 (first pipeline L1), multiple valves V1 (first valve V1) and multiple pipelines L2 (second pipeline L2). Each of the multiple pipelines L1 is equipped with each corresponding one of the multiple valves V1, respectively. Further, the multiple pipelines L1 are respectively connected to multiple gas sources GS.

In the present exemplary embodiment, the multiple gas supply sources GS include fourteen (14) gas supply sources, i.e., gas supply sources GS(1) to GS(14). However, the number of the gas supply sources GS is not limited to this example. As one example, the gas supply sources GS(1) to GS(14) are a source of a $C_2F_8$ gas, a source of a $C_4F_6$ gas, a source of a He gas, a source of a $CF_4$ gas, a source of a $CH_4$ gas, a source of a CO gas, a source of a COS gas, a source of a $N_2$ gas, a source of a $NF_3$ gas, a source of a $CHF_3$ gas, a source of an Ar gas, a source of a $CH_2F_2$ gas, and a source of a $CO_2$ gas.

Each of the integral units GI includes one of the multiple pipelines L2; one or more pipelines L1 branched from the one pipeline L2 and respectively connected to one or more gas supply sources GS; and one or more valves V1 respectively provided on the one or more pipelines L1. Each integral unit GI is connected to the one or more gas supply sources GS which are not used concurrently. Each integral unit GI is capable of supplying a gas from a gas supply source GS selected from the one or more gas supply sources GS connected to this integral unit GI.

In the example shown in FIG. 13, three pipelines L1 respectively connected to the gas sources GS(1) to GS(3), three valves V1 respectively provided on these pipelines L1 and a single pipeline L2 to which the three pipelines L1 are connected constitute a single integral unit GI. Further, three pipelines L1 respectively connected to the gas sources GS(4) to GS(6), three valves V1 respectively provided on these pipelines L1 and a single pipeline L2 to which the three pipelines L1 are connected constitute another single integral unit GI. Further, two pipelines L1 respectively connected to the gas sources GS(7) and GS(8), two valves V1 respectively provided on these pipelines L1 and a single pipeline L2 to which the two pipelines L1 are connected constitute another single integral unit GI. Furthermore, three pipelines L1 respectively connected to the gas sources GS(9) to GS(11), three valves V1 respectively provided on these pipelines L1 and a single pipeline L2 to which the three pipelines L1 are connected constitute another single integral unit GI. In addition, three pipelines L1 respectively connected to the gas sources GS(12) to GS(14), three valves V1 respectively provided on these pipelines L1 and a single pipeline L2 to which the three pipelines L1 are connected constitute still another single integral unit GI.

The second device GM2 is provided downstream of the first device GM1. The second device GM2 is configured to distribute multiple gases from the integral units and supply the gases while controlling the flow rates thereof.

The second device GM2 includes multiple flow rate control unit groups FUG and multiple pipelines L3 (third pipelines L3). The number of the multiple flow rate control unit groups FUG is the same as the number of gas discharging units of the processing apparatus to be described later. In the example shown in FIG. 13, the number of the flow rate control unit groups FUG is three. Here, the number of the flow rate control unit groups FUG and the number of the gas discharging units are not particularly limited as long as they are plural.

Each of the flow rate control unit group FUG includes multiple flow rate control units FU. The number of the multiple flow rate control units FU belonging to each flow rate control unit group FUG is the same as the number of the pipelines L2. Each flow rate control unit FU controls the flow rate of the gas. Each flow rate control unit FU includes a primary valve FV1, a flow rate controller FD and a secondary valve FV2. The flow rate controller FD is provided between the primary valve FV1 and the secondary valve FV2.

Here, the flow rate controller FD in this exemplary embodiment is, by way of example, the pressure type flow rate control device FCS described above with reference to FIG. 1. Further, the primary valve FV1 and the secondary valve FV2 in each flow rate control unit FU are disposed on the base 212, as described with reference to FIG. 2, for example. Furthermore, in each flow rate control unit FU, the primary valve FV1 and the secondary valve FV2 are disposed on the surface 212b, which is opposite to the surface 212a of the base 212 where the flow rate controller FD is provided. In addition, the flow rate controller FD and the primary valve FV1 are connected with the straight pipeline GL1 which penetrates the base 212, and the flow rate controller FD and the secondary valve FV2 are connected with the straight pipeline GL2 which penetrates the base 212.

With this configuration, in each flow rate control unit FU according to the present exemplary embodiment, the pipeline GL1 between the flow rate controller FD and the primary valve FV1 and the pipeline GL2 between the flow rate controller FD and the secondary valve FV2 can be shortened, as compared to the configuration in which the primary valve FV1, the secondary valve FV2 and the flow rate controller FD are disposed on the single surface of the base 212. Accordingly, in each flow rate control unit FU according to the present exemplary embodiment, the volume of the pipeline GL1 between the flow rate controller FD and the primary valve FV1 and the volume of the pipeline GL2 between the flow rate controller FD and the secondary valve FV2 can be reduced. In addition, the flow rate controller FD may be implemented by, besides the pressure type flow rate control device, a mass flow controller MFC configured to control the gas flow rate based on a mass flow rate of a fluid, or the like.

Through each of the multiple pipelines L3, the gas from each corresponding one of the pipelines L2 is distributed into the plurality of flow rate control unit groups FUG and is supplied into the single flow rate control unit FU belonging to each of the flow rate control unit group FUG. Thus, each of the pipelines L3 is branched into multiple pipelines. The number of the branched pipelines of the single pipeline L3 is the same as the number of the flow rate control unit groups FUG.

In the present exemplary embodiment, the second device GM2 further includes multiple joint lines ML. Each of the joint lines ML is configured to merge the gases from the multiple flow rate control units FU belonging to each corresponding one of the flow rate control unit group FUG. Thus, each joint line ML is configured to be merged into a single pipeline from multiple pipelines. The number of the pipelines that joins each joint line ML is the same as the number of the pipelines L2 and the number of the flow rate control units FU within each flow rate control unit group FUG.

The third device GM3 is configured as an exhaust device of the gas supply system GP1. The third device GM3 includes a gas exhaust line EL, a plurality of pipelines L4 (fourth pipelines L4) and multiple valves V4 (fourth valve V4).

The gas exhaust line EL is provided with a valve V2 (second valve V2) and a valve V3 (third valve V3). The valve V2 is provided upstream of the gas exhaust line EL, and the valve V3 is provided downstream of the gas exhaust line EL. At the upstream side thereof, the gas exhaust line EL is connected to a gas supply source GSP for a purge gas via the valve V2. The purge gas is an inert gas such as, but not limited to, a $N_2$ gas. Further, at the downstream side thereof, the gas exhaust line EL is connected to a gas exhaust device such as a turbo molecular pump or a dry pump via the valve V3. In the present exemplary embodiment, the gas exhaust line EL is connected to a pipeline between a turbo molecular pump and a dry pump. Further, as will be described later, the turbo molecular pump may be connected to a processing vessel, and the dry pump may be provided downstream of the turbo molecular pump in the processing system according to the present exemplary embodiment.

The pipelines L4 are configured to connect the gas exhaust line EL and the multiple pipelines L2. Each pipeline L4 is provided with each corresponding one of the valves V4.

In the present exemplary embodiment, the gas exhaust line EL is connected to a pressure gauge PM. The pressure gauge PM is configured to measure a pressure of a flow path within the gas exhaust line EL. In the present exemplary embodiment, the pressure gauge PM is connected to the gas exhaust line EL at an upstream side of the valve V3, that is, at a position closer to the valve V3 than the valve V2. Further, the pressure gauge PM may be provided upstream of the valve V3 and downstream of joint positions between the pipelines L4 and the gas exhaust line EL.

In the gas supply system GP1 according to the present exemplary embodiment, the valve V2, the valve V3 and all the valves V4 are closed, and, among the valves V1 of the integral units GI, a single valve V1 connected to the gas supply source GS storing therein a required gas is opened, and a flow rate of the gas is controlled by the flow rate control units FU of the flow rate control unit groups FUG. Accordingly, the required gas can be supplied into a processing apparatus to be described later at a required flow rate from each joint line ML.

Further, when changing the gas to be supplied into the processing apparatus from the gas supply system GP1, the operations of the flow rate control units FU of the flow rate control unit groups FUG are stopped, and all the valves V1 are closed, whereas the valve V2, the valve V3 and all the valves V4 are opened. With this operation, the gas remaining in the flow paths from the valve V1 to each of the flow rate control units FU can be exhausted through the gas exhaust line EL at a high speed. Furthermore, in the present exemplary embodiment, the flow rate controller FD within each flow rate control unit FU is the pressure type flow rate control device. Thus, by opening the primary valve FV1 within each flow rate control unit FU when closing all the valves V1 and opening the valve V2, the valve V3 and all the valves V4, the gas remaining in the gas line at the upstream side of the orifice within each flow rate control unit FU can also be exhausted at a high speed.

Subsequently, the valve V2, the valve V3 and all the valves V4 are closed, and, among the valves V1 of the integral units GI, a single valve V1 connected to the gas supply source GS storing therein a required gas is opened, and a flow rate of the gas is controlled by the flow rate control units FU of the flow rate control unit groups FUG. Accordingly, the changed gas can be supplied into the processing apparatus. As stated, in the gas supply system GP1, the gas within the flow paths of the gas supply system GP1 can be replaced at a high speed, that is, in a short time period.

<Overall Configuration of Processing System 10b>

Figure 14:
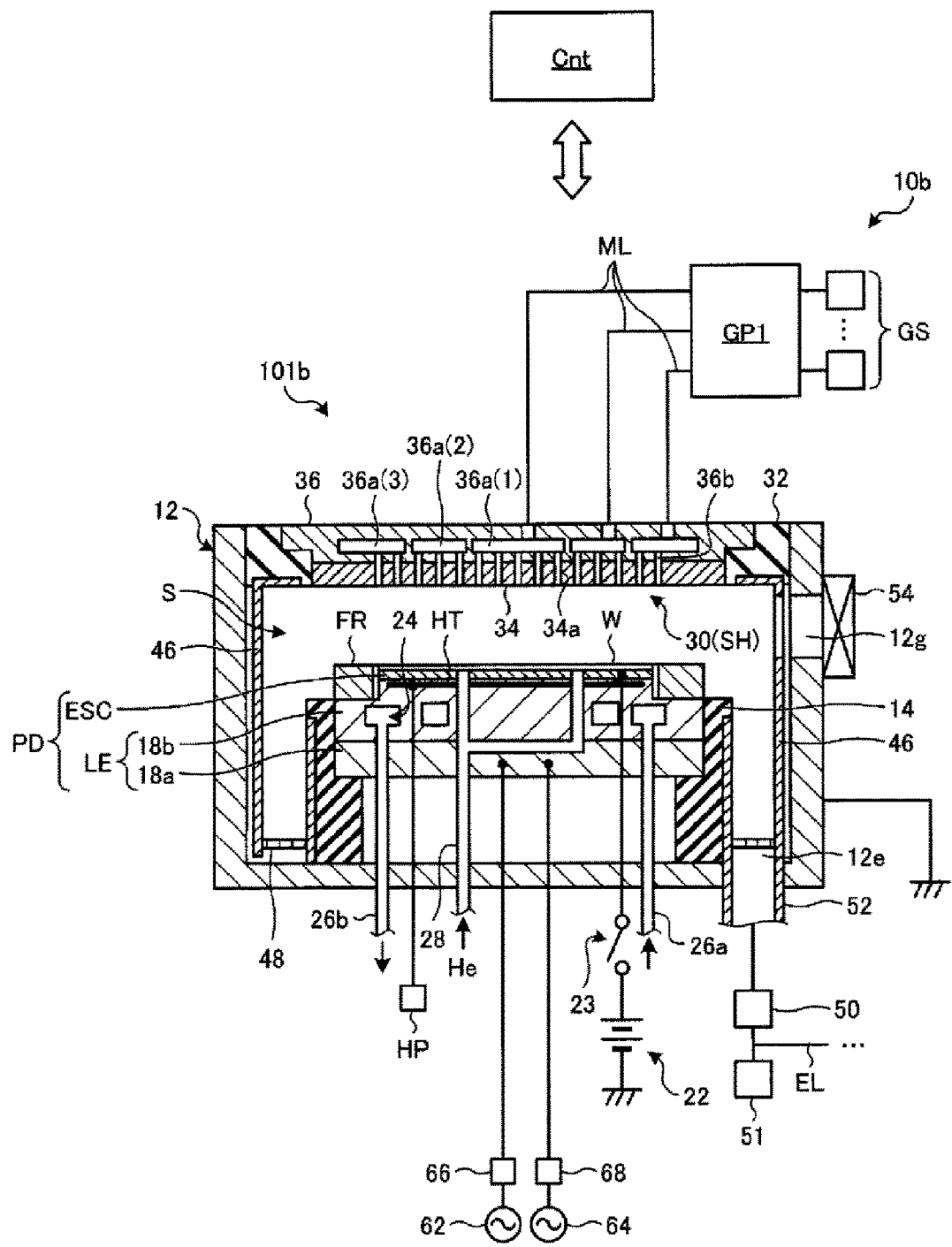
FIG. 14 is a diagram illustrating an example of a processing system according to the second exemplary embodiment.

Now, an example of a processing system according to the present exemplary embodiment will be explained. FIG. 14 is a diagram illustrating an example of a processing system 10b in the second exemplary embodiment. The processing system 10b shown in FIG. 14 includes a processing apparatus 101b and the gas supply system GP1 which is described above with reference to FIG. 13. In the present exemplary embodiment, the processing apparatus 101b is configured as, by way of non-limiting example, a capaci-tively coupled plasma etching apparatus. In the following description, the processing apparatus 101b may also be referred to as a reactor unit.

The processing apparatus 101b includes a substantially cylindrical processing vessel 12. The processing vessel 12 is made of, but not limited to, aluminum, and a surface of an inner wall thereof is anodically oxidized. Further, the processing vessel 12 is frame-grounded. Further, a carry-in/out opening 12g for a semiconductor wafer W is formed through a sidewall of the processing vessel 12. The carry-in/out opening 12g is opened or closed by a gate valve 54.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the semiconductor wafer W on a top surface thereof. The mounting table PD includes a lower electrode LE and an electrostatic chuck ESC. The lower electrode LE is provided with a substantially disk-shaped first plate 18a and a second plate 18b. The first plate 18a and the second plate 18b are made of a metal such as, but not limited to, aluminum. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the semiconductor wafer W by an electrostatic force such as a Coulomb force generated by a DC voltage applied from the DC power supply 22. Accordingly, the electrostatic chuck ESC is capable of holding the semiconductor wafer W thereon.

A focus ring FR is provided on a peripheral portion of the second plate 18b to surround an edge of the semiconductor wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant supplied from the chiller unit is circulated through the coolant path 24. A temperature of the semiconductor wafer W held by the electrostatic chuck ESC is controlled to a preset temperature by adjusting a temperature of the coolant which is circulated through the coolant path 24 by the chiller unit.

Furthermore, the processing apparatus 101b is provided with a gas supply line 28. Through the gas supply line 28, a heat transfer gas, e.g., a He gas, is supplied from a heat transfer gas supply device into a gap between a top surface of the electrostatic chuck ESC and a rear surface of the semiconductor wafer W.

The processing apparatus 101b is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted, and, thus, the temperature of the semiconductor wafer W placed on the mounting table PD is adjusted to a preset temperature. Alternatively, the heater HT may be embedded in the electrostatic chuck ESC.

Further, the processing apparatus 101b includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space S in which a plasma process is performed on the semiconductor wafer W.

The upper electrode 30 is supported at an upper portion of the processing vessel 12 with an insulating shield member 32 therebetween. The upper electrode 30 is configured such that a distance from the top surface of the mounting table PD, i.e., a mounting surface on which the semiconductor wafer W is placed is variable in a vertical direction. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A plurality of gas diffusion spaces 36a is formed within the electrode supporting body 36. The gas diffusion spaces 36a are arranged substantially in a concentric manner with respect to a vertically extended axis line which passes through a center of the semiconductor wafer W mounted on the mounting table PD, i.e., a center of the mounting table PD. As depicted in FIG. 14, each of the gas diffusion spaces 36a is connected to each corresponding one of the multiple joint lines ML belonging to the gas supply system GP1.

In the example shown in FIG. 14, the gas diffusion space 36a includes three diffusion spaces, that is, a gas diffusion space 36a(1), a gas diffusion space 36a(2) and a gas diffusion space 36a(3). The gas diffusion space 36a(1) is arranged on the aforementioned axis line, and may have a substantially circular plane shape when viewed from the vertical direction. The gas diffusion space 36a(2) is annularly extended at the outside of the gas diffusion space 36a(1). Further, the gas diffusion space 36a(3) is annularly extended at the outside of the gas diffusion space 36a(2).

As illustrated in FIG. 14, the electrode supporting body 36 is provided with a multiple number of communication holes 36b extended downwards from each of the gas diffusion spaces 36a. The communication holes 36b allow the gas discharge holes 34a to communicate with the corresponding gas diffusion spaces 36a. In the exemplary embodiment, the upper electrode 30 serves as a shower head SH which supplies the gas supplied from the gas supply system GP1 into the processing space S within the processing apparatus 101b.

In the shower head SH, a single gas diffusion space 36a and multiple gas discharge holes 34a connected to this gas diffusion space 36a constitute a single gas discharging unit. Accordingly, the shower head SH is provided with plural gas discharging units. From these plural gas discharging units, a gas can be supplied toward different zones within the processing vessel 12, that is, toward different regions on the semiconductor wafer W in a radial direction.

Further, in the processing apparatus 101b according to the exemplary embodiment, a deposition shield 46 is detachably provided along the inner wall of the processing vessel 12. The deposition shield 46 is also provided on an outer side surface of the supporting member 14. The deposition shield 46 is configured to suppress an etching byproduct (deposit) from adhering to the processing vessel 12, and may be formed of an aluminum member coated with ceramics such as $Y_2O_3$.

At the bottom portion of the processing vessel 12, a gas exhaust plate 48 is provided between the supporting member 14 and the sidewall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 and a gas exhaust device 51 via a gas exhaust line 52. In the exemplary embodiment, the gas exhaust device 50 is, for example, a turbo molecular pump, and the gas exhaust device 51 is, for example, a dry pump. On a gas exhaust path, the gas exhaust device 50 is provided at the upstream side of the gas exhaust device 51. The gas exhaust line EL of the gas supply system GP1 is connected to a pipeline between the gas exhaust device 50 and the gas exhaust device 51. Since the gas exhaust line EL is connected between the gas exhaust device 50 and the gas exhaust device 51, a backflow of the gas from the gas exhaust line EL into the processing vessel 12 can be suppressed.

The processing apparatus 101b further includes a first high frequency power supply 62 and a second high frequency power supply 64. The first high frequency power supply 62 is configured to generate a first high frequency power for plasma generation. That is, the first high frequency power supply 62 generates the first high frequency power having a frequency ranging from 27 MHz to 100 MHz, e.g., 40 MHz. The first high frequency power supply 62 is connected to the lower electrode LE via a matching device 66. The matching device 66 is a circuit configured to match an output impedance of the first high frequency power supply 62 and an input impedance at a load side (lower electrode LE).

The second high frequency power supply 64 is configured to generate a second high frequency power for ion attraction into the semiconductor wafer W, i.e., a high frequency bias power having a frequency ranging from 400 kHz to 13.56 MHz, e.g., 3.2 MHz. The second high frequency power supply 64 is connected to the lower electrode LE via a matching device 68. The matching device 68 is a circuit configured to match an output impedance of the second high frequency power supply 64 and the input impedance at the load side (lower electrode LE).

The processing apparatus 101b further includes a controller Cnt. The controller Cnt is a computer including a processor, a memory unit, an input device, a display device, and so forth, and is configured to control individual components of the processing apparatus 101b. To be specific, the controller Cnt controls the individual components of the processing apparatus 101b such that the processing apparatus 101b is operated according to an operation method to be described below.

The processing apparatus 101b configured to generate plasma by exciting the gas supplied into the processing vessel 12 from the gas supply system GP1. Further, the processing apparatus 101b is configured to process the semiconductor wafer W by active species contained in the generated the plasma. Furthermore, the gases used in the processing of the semiconductor wafer W can be supplied into the processing vessel 12 while being changed at a high speed by the gas supply system GP1. Accordingly, in a process where different kinds of plasma processes are performed on the semiconductor wafer W alternately, for example, the throughput of the process can be improved.

Figure 15:
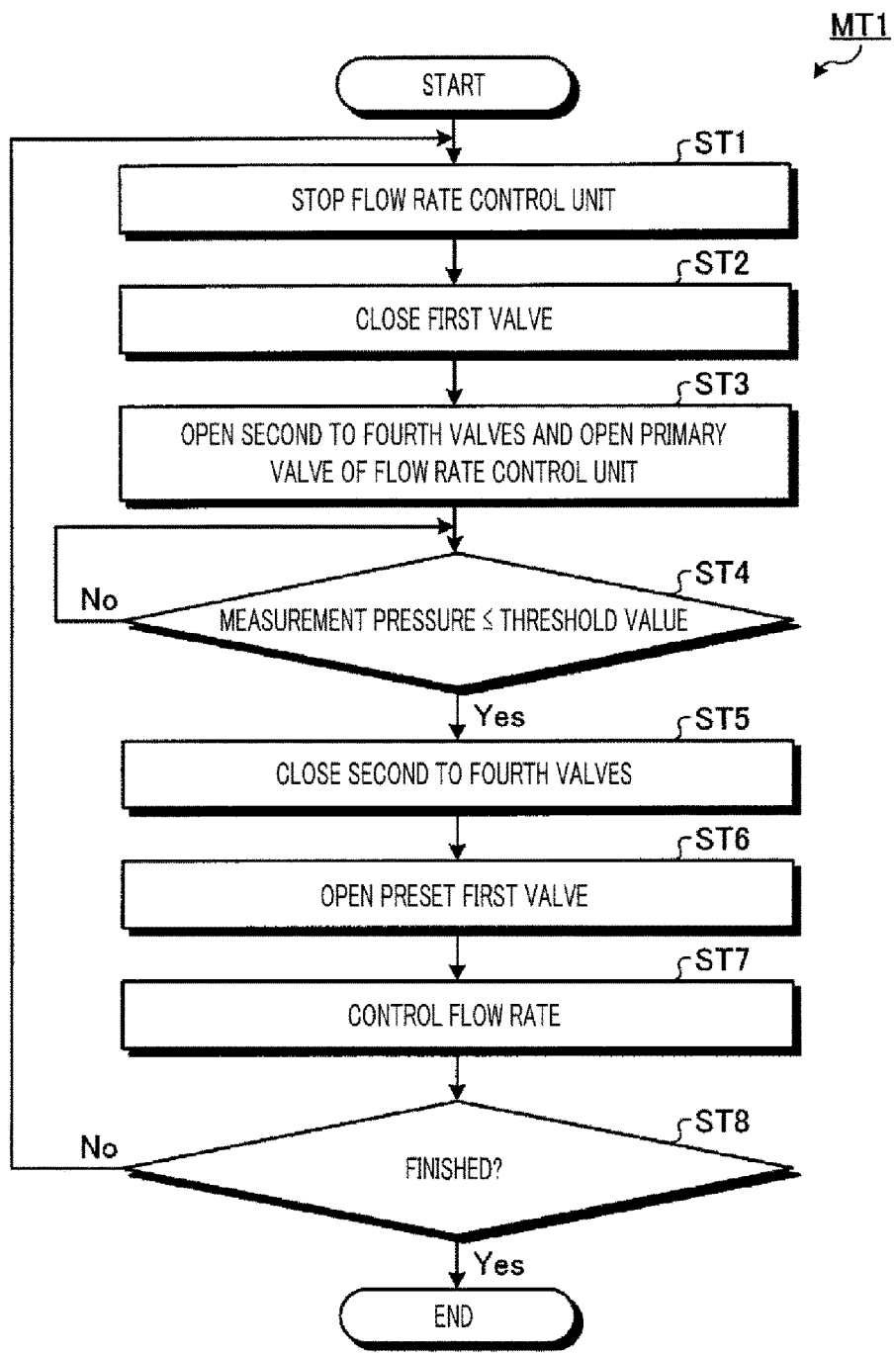
FIG. 15 is a flowchart for describing an example of an operation method for the processing system according to the second exemplary embodiment.

Hereinafter, the operation method of the processing system 10b in the present exemplary embodiment will be explained. FIG. 15 is a flowchart illustrating an example of the operating method of the processing system 10b in the second exemplary embodiment. The operation method MT1 shown in FIG. 15 includes several processes for exhausting the gas within the gas supply system GP1. Further, according to the operation method MT1, by supplying different kinds of gases into the processing vessel 12 of the processing apparatus 101b in sequence after replacing the gases within the gas supply system GP1, different kinds of plasma processes can be performed on the semiconductor wafer W. FIG. 15 shows a sequence of the operation method in which a gas remaining in the gas supply system GP1 is exhausted and a gas is supplied into the processing vessel 12.

In the operation method MT1, the gas within the gas supply system GP1 is exhausted in processes ST1 to ST4, as shown in FIG. 15. In the process ST1, the operations of all the flow rate control units FU of the flow rate control unit groups FUG are stopped. In the subsequent process ST2, all the valves V1 are closed. Accordingly, the gas supply into the gas supply system GP1 from all of the gas supply sources GS is stopped. In the subsequent process ST3, the valve V2, the valve V3 and all the valves V4 are opened, and the primary valve FV1 of each flow rate control unit FU is also opened. Accordingly, the gas remaining within the pipelines from the valve V1 to all of the flow rate control units FU is exhausted through the gas exhaust line EL.

In the subsequent process ST4, a pressure of the flow path within the gas exhaust line EL is measured by the pressure gauge PM. In the process ST4, it is also detected whether the pressure of the flow path within the gas exhaust line EL is equal to or less than a threshold value. The threshold value is, for example, 500 mTorr (66.66 Pa). In case that the pressure of the flow path within the gas exhaust line EL is larger than the threshold value, the gas exhaust is continued. Meanwhile, if the pressure of the flow path within the gas exhaust line EL is equal to or less than the threshold value, it is determined that the gas exhaust of the gas supply system GP1 is completed, and then, a subsequent process ST5 is performed.

In the subsequent process ST5, the valve V2, the valve V3 and all the valves V4 are closed. In a subsequent process ST6, among the multiple number of valves V1, a single valve V1 connected to a gas supply source GS storing therein a required gas is opened. In a subsequent process ST7, a flow rate of the gas is controlled by the multiple flow rate control units FU. With these operations, the required gas is supplied into the processing vessel 12 of the processing apparatus 101b. Within the processing vessel 12 of the processing apparatus 101b, plasma of the gas supplied from the gas supply system GP1 is generated, and a preset process is performed on the semiconductor wafer W by active species contained in the plasma.

Then, in a subsequent process ST8, it is determined whether the processing upon the semiconductor wafer W is finished. If the processing upon the semiconductor wafer W is not finished, that is, if another process with another gas is to be performed, the processes from ST1 to ST7 are repeated. Meanwhile, if it is determined in the process ST8 that the processing is finished, the operation method MT1 is ended. Further, the processes from ST1 to ST8 are conducted as the individual components of the processing apparatus 101b are operated under the control of the controller Cnt.

According to the operation method MT1 shown in FIG. 15, when changing the gas to be supplied into the processing apparatus 101b, the gas remaining in the pipelines within the gas supply system GP1 can be exhausted at a high speed. Accordingly, when changing the gas to be supplied from the gas supply system GP1, the time required to replace the gas within the gas supply system GP1 can be shortened. As a result, the processes in which different kinds of gases are used in sequence can be performed with high throughput.

Here, the flow rate controller FD in the present exemplary embodiment is the pressure type flow rate controller FD having the same configuration as shown FIG. 1, for example. In the pressure type flow rate controller FD, when changing a gas as a target of flow rate control, for example, it is required to wait for the gas within the gas line (the pipeline GL1, the pipeline 206, the pipeline 207, the pipeline 208 and the pipeline GL2 shown in FIG. 1) in the flow rate controller FD to be exhausted. When changing a flow rate of the gas from a higher flow rate to a lower flow rate as well, it is required to wait for the gas to be exhausted until the pressure within the gas line in the flow rate controller FD becomes equal to or less than a preset pressure.

When the primary valve FV1 is closed, the gas within the gas line (the pipeline GL1, the pipeline 206 and the pipeline 207 shown in FIG. 1) at the upstream side of the orifice 205 flows into the processing apparatus 101b via the orifice 205, and is exhausted by the gas exhaust device 50 and the gas exhaust device 51 connected to the processing vessel 12. Since it takes time for the gas to be flown out of the orifice 205, it takes a very long time (hereinafter, referred to as "waiting time") for the gas remaining in the gas line at the upstream side of the orifice 205 to be exhausted.

To reduce this waiting time, it may be considered to reduce the volume of the gas line at the upstream side of the orifice 205. However, there may be difficulty in fabricating such gas line. Further, as stated in the first exemplary embodiment, in order to improve the controllability over the gas flow rate, it is desirable to set a volume $V_1$ of the gas line at the upstream side of the orifice 205 to be larger than a volume $V_2$ of the gas line at the downstream side of the orifice 205 by at least one digit number. For this reason, if the volume $V_1$ of the gas line at the upstream side of the orifice 205 is set to be small, the volume $V_2$ of the gas line at the downstream side of the orifice 205 needs to be further reduced. As a result, it is further difficult to fabricate the gas line at the downstream side of the orifice 205.

Therefore, according to the present exemplary embodiment, when changing the gas as the target of flow rate control, the gas remaining in the gas line at the upstream side of the orifice 205 is exhausted through the gas exhaust line EL by opening the primary valve FV1, as described in the process ST3 of FIG. 15. Accordingly, the waiting time required to change the gas as the target of the flow rate control can be shortened. Hence, in the processing in which different kinds of plasma processes are performed on the semiconductor wafer W alternately while changing gases, the throughput of the process can be improved.

<Relationship Between Volume of Pipeline and Time Required to Exhaust Gas>

Figure 16:
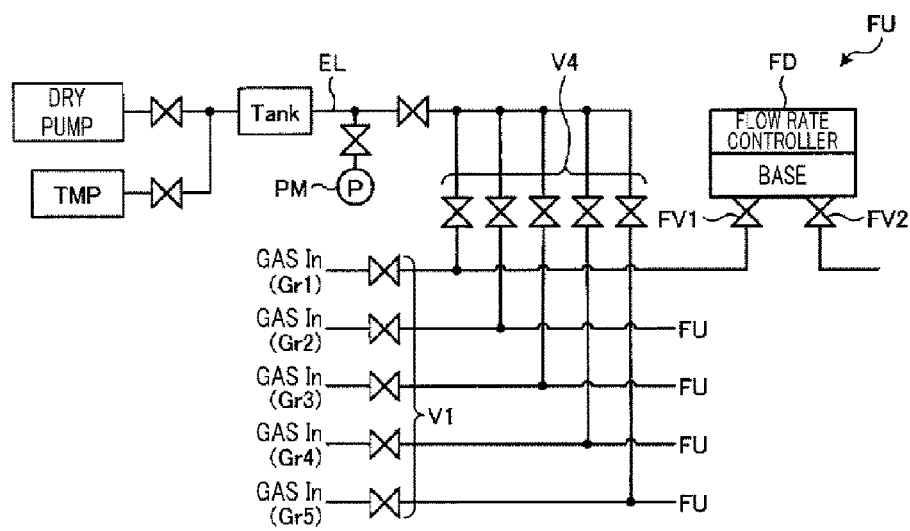
FIG. 16 is a diagram illustrating an example of an experiment system.

Here, there is conducted an experiment to investigate a relationship between volumes of each pipeline L2 and each pipeline L3 and time required to exhaust a gas remaining in each pipeline L2 and each pipeline L3 in the gas supply system GP1 shown in FIG. 13. FIG. 16 is a diagram illustrating an example of an experiment system. In the experiment system, a plurality of gas supply sources (gas In(Gr1) to gas In(Gr5)) are respectively connected to flow rate control units FU via valves V1, as depicted in FIG. 16. Further, pipelines between the valves V1 and primary valves FV1 of the flow rate control units FU are connected to a gas exhaust line EL via valves V4, respectively. The gas exhaust line EL is connected to a pressure gauge PM via a valve. Further, the gas exhaust line EL is also connected to a dry pump and a turbo molecular pump (TMP) via a Tank configured to simulate a volume of the gas exhaust line EL of the gas supply system GP1. The pipeline between the valve V1 and the primary valve FV1 corresponds to the pipeline L2 and the pipeline L3 in the gas supply system GP1 shown in FIG. 13. In the experiment, a pressure of the gas exhaust line EL and a back pressure of the TMP when opening the valves V4 is measured by using the experiment system shown in FIG. 16. Further, in the experiment, the primary valve FV1 and the control valve 201 within the flow rate controller FD of each flow rate control unit FU are opened, and the secondary valve FV2 is closed.

<Experiment Result>

Figure 17:
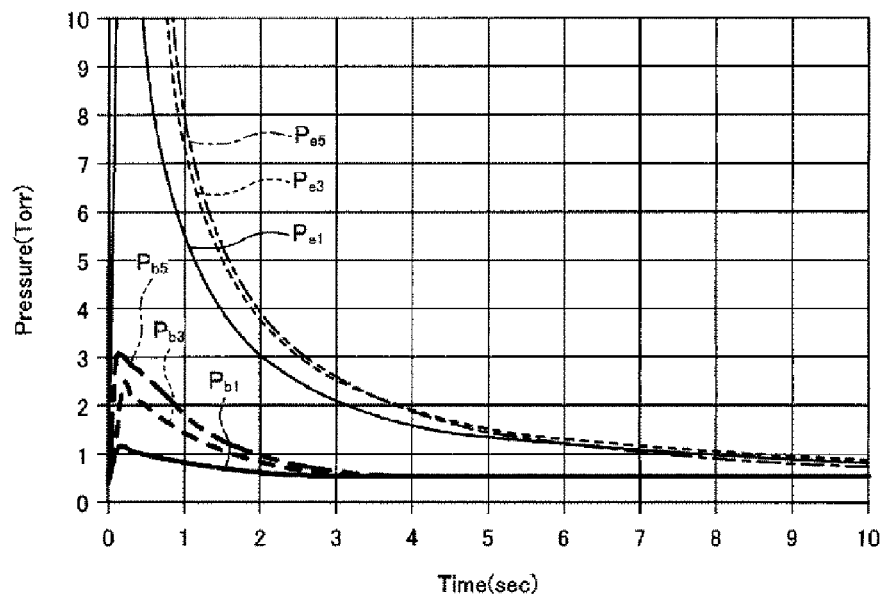
FIG. 17 is a diagram illustrating an example of an experiment result.

FIG. 17 is a diagram illustrating an example of an experiment result. In FIG. 17, a horizontal axis indicates time, and a vertical axis represents a pressure within the gas exhaust line EL or the back pressure of the TMP. In FIG. 17, $P_{e5}$ indicates the variation of the pressure within the gas exhaust line EL with a lapse of time in case of opening all the valves V4 connected to the pipelines of the gas In(Gr1) to gas In(Gr5). $P_{e3}$ denotes the variation of the pressure within the gas exhaust line EL with a lapse of time in case of opening three valves V4 connected to the pipelines of the gas In(Gr1) to gas In(Gr3). $P_{e1}$ indicates the variation of the pressure within the gas exhaust line EL with a lapse of time in case of opening one valve V4 connected to the pipeline of the gas In(Gr1).

Further, in FIG. 17, $P_{b5}$ indicates the variation of the back pressure of the TMP with a lapse of time in case of opening all the valves V4 connected to the pipelines of the gas In(Gr1) to gas In(Gr5). $P_{b3}$ indicates the variation of the back pressure of the TMP with a lapse of time in case of opening the three valves V4 connected to the pipelines of the gas In(Gr1) to gas In(Gr3). Further, $P_{b1}$ indicates the variation of the back pressure of the TMP with a lapse of time in case of opening one valve V4 connected to the pipeline of the gas In(Gr1).

From the experiment result shown in FIG. 17, if the valve V4 is opened, the pressure within the gas exhaust line EL increases up to 4500 Torr temporarily and then decreases to 10 Torr or less. The time required for the pressure within the gas exhaust line EL to be lowered to 10 Torr is about 0.5 sec on $P_{e1}$, about 0.8 sec on $P_{e3}$, and about 0.9 sec on $P_{e5}$. From the experiment result of FIG. 17, if the number of the pipelines as a target of gas exhaust increases, that is, a total volume of the pipelines as the target of gas exhaust increases, the time for the pressure within the gas exhaust line EL to reach the preset pressure or less tends to be lengthened.

Furthermore, in the experiment result shown in FIG. 17, a peak of the back pressure of the TMP is found to about 3.0 Torr on $P_{b5}$, about 2.5 Torr on $P_{b3}$, and about 1.1 Torr on $P_{b1}$. As can be seen from the experiment result of FIG. 17, if the total volume of the pipelines as the target of gas exhaust increases, the peak of the back pressure of the TMP tends to be increased.

Further, as can be seen from the experiment result of FIG. 17, by reducing the volume of the pipelines as the target of gas exhaust, the time for gas exhaust can be shortened, and the peak of the back pressure of the TMP can be reduced.

Accordingly, in each flow rate control unit FU within the gas supply system GP1 according to the present exemplary embodiment, as described with reference to FIG. 2 for example, the primary valve FV1 and the secondary valve FV2 are disposed on the surface 212b, which is opposite to the surface 212a of the base 212 where the flow rate controller FD is provided; and the flow rate controller FD and the primary valve FV1 are connected with the straight pipeline GL1 that penetrates the base 212; and the flow rate controller FD and the secondary valve FV2 are connected with the straight pipeline GL2 that penetrates the base 212. Accordingly, the volumes of the pipeline GL1 and the pipeline GL2 constituting a part of the pipelines as the exhaust target of the residual gas can be reduced. Therefore, since the volume of the pipeline as the target of gas exhaust can be set to be small, the gas exhaust time can be shortened and the peak of the back pressure of the TMP can be reduced. Furthermore, since the volume of the pipeline can be set to be small, it is possible to reduce the amount of the gas wasted when performing a process while changing the gas.

Further, in the present exemplary embodiment, for the primary valve FV1, the flow rate controller FD and the secondary valve FV2 as examples of the multiple element devices constituting the gas supply system GP1, some of the element devices is placed on the surface 212a of the base 212, and other element devices are placed on the surface 212b, which is opposite to the surface 212a where the some of the element devices are provided. Further, the some of the element devices and the other element devices are connected with straight pipelines that penetrate the base 212. However, the element devices separately disposed on the different surfaces of the base 212 are not limited to the primary valve FV1, the flow rate controller FD and the secondary valve FV2, and it is desirable to place other element devices constituting the gas supply system GP1 shown in FIG. 13 on different surfaces of the base 212 separately and to connect the element devices on the different surfaces with the straight pipeline that penetrates the base 212. With this configuration, the gas exhaust time can be further shortened, and the peak of the back pressure of the TMP can be further suppressed. Further, when performing a process while changing the gases, the waste amount of the gas can be further reduced.

<Relationship Between Length of Pipeline and Pressure within the Processing Apparatus 101b>

FIG. 18A and FIG. 18B are diagrams illustrating an example of a pressure variation within the processing vessel 12 with respect to a length of a pipeline. FIG. 18A is a diagram showing an experiment result of the pressure variation within the processing vessel 12 after the gas supply from the gas supply system GP1 into the processing vessel 12 of the processing apparatus 101b is begun. FIG. 18B is a diagram showing an experiment result of the pressure variation within the processing vessel 12 when the gas supply from the gas supply system GP1 into the processing vessel 12 of the processing apparatus 101b is stopped and the inside of the processing vessel 12 is exhausted. Further, in FIG. 18A and FIG. 18B, $P_{11}$ indicates the pressure variation within the processing vessel 12 when the length of the pipeline from the flow rate controller FD within the gas supply system GP1 to the processing apparatus 101b is 0.5 m, and $P_{22}$ denotes the pressure variation within the processing vessel 12 when the length of the pipeline from the flow rate controller FD within the gas supply system GP1 to the processing apparatus 101b is 3.0 m.

Referring to FIG. 18A, the pressure $P_{11}$ in case of using the pipeline of 0.5 m is found to increase about 0.1 sec to 0.2 sec faster than the pressure $P_{22}$ in case of using the pipeline of 3.0 m. Further, referring to FIG. 18B, the pressure $P_{11}$ in case of using the pipeline of 0.5 m is found to decrease about 1 sec faster than the pressure $P_{22}$ in case of using the pipeline of 3.0 m. As described above, by shortening the pipeline from the flow rate controller FD within the gas supply system GP1 to the processing apparatus 101b, the response characteristic of the pressure within the processing vessel 12 can be improved.

Here, in each flow rate control unit FU of the gas supply system GP1 of the present exemplary embodiment, as described with reference to FIG. 2, for example, the secondary valve FV2 is disposed on the surface 212b, which is opposite to the surface 212a of the base 212 where the flow rate controller FD is disposed, and the flow rate controller FD and the secondary valve FV2 are connected with the straight pipeline GL2 which penetrates the base 212. With this configuration, the pipeline GL2 in the pipeline from the flow rate controller FD to the processing apparatus 101b can be shortened. Accordingly, in the gas supply system GP1 according to the present exemplary embodiment, the response characteristic of the pressure within the processing vessel 12 can be improved.

[Third Exemplary Embodiment]

Figure 19:
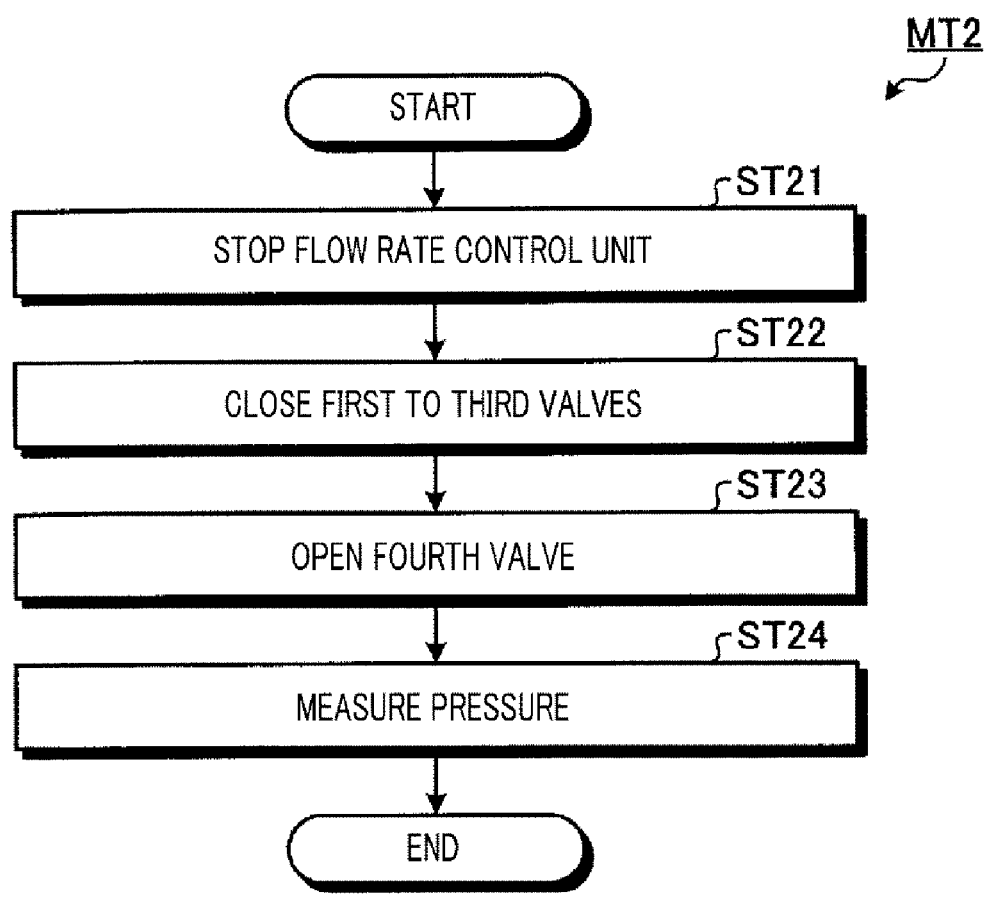
FIG. 19 is a flowchart for describing an example of an operation method for the processing system according to a third exemplary embodiment.

Now, a third exemplary embodiment will be explained. FIG. 19 is a flowchart for describing an operation method of a processing system 10b according to the third exemplary embodiment. The operation method MT2 of the processing system 10b shown in FIG. 19 is directed to a method for detecting leakages of multiple valves V1. Further, the operation method MT2 in the present exemplary embodiment is also applicable to a processing system 10c of a fourth and a fifth exemplary embodiment and a processing system 10d of a sixth exemplary embodiment to be described later.

In the operation method MT2 of the third exemplary embodiment, in order to detect a leakage, operations of all the flow rate control units FU are stopped in a process ST21. In a subsequent process ST22, all the valves V1, the valve V2 and the valve V3 are closed. In a subsequent process ST23, all the valves V4 are opened. Further, in a process ST24, the pressure of the flow path within the gas exhaust line EL is measured by the pressure gauge PM.

When measuring the pressure in the process ST24, all the valves V1 connected to the gas supply sources GS, the valve V2 and the valve V3 are closed, and the operations of all the flow rate control units FU are stopped. Accordingly, if the valves V1 are not leaked, the pressure within the gas exhaust line EL hardly varies. Thus, by determining whether the variation in the measurement value of the pressure gauge PM has occurred in the process ST24, the leakage of any one of the valves V1, if any, can be detected.

[Fourth Exemplary Embodiment]

Figure 20:
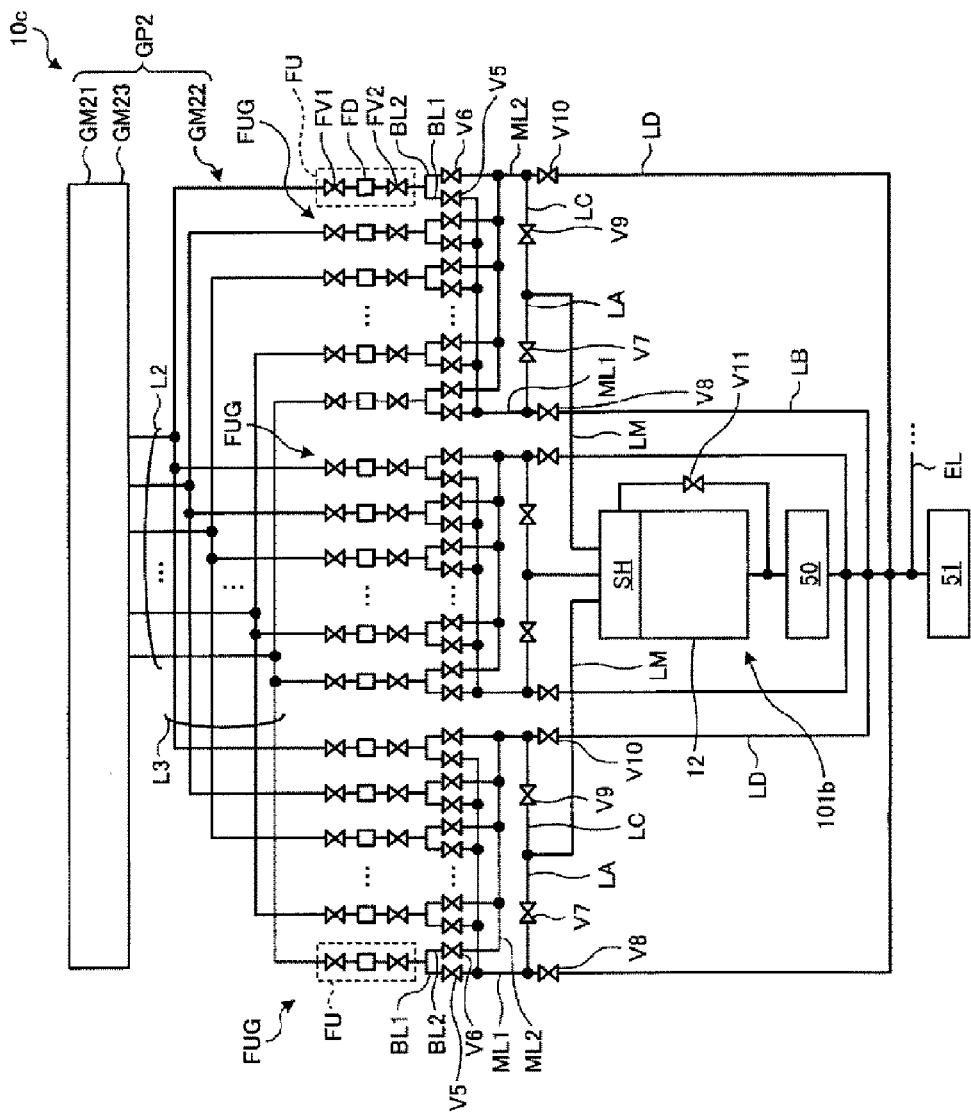
FIG. 20 is a diagram illustrating an example of a processing system according to a fourth exemplary embodiment.

Now, a fourth exemplary embodiment will be explained. FIG. 20 is a diagram illustrating an example of a processing system 10c in the fourth exemplary embodiment. The processing system 10c of the present exemplary embodiment includes a gas supply system GP2 and a processing apparatus 101b. Since the processing apparatus 101b is the same as the processing apparatus 101b described in the second exemplary embodiment, redundant description thereof will be omitted.

The gas supply system GP2 includes a first device GM21, a second device GM22 and a third device GM23. The first device GM21 is different from the first device GM1 in that the number of the integral units GI within the first device GM21 is larger than the number of the integral units GI of the first device GM1 of the gas supply system GP1. Except this, the other configuration of the first device GM21 is the same as that of the first device GM1. Thus, as depicted in FIG. 20, a larger number of the pipelines L2 than those of the first device GM1 is extended from the first device GM21.

The third device GM23 is different from the third device GM3 of the gas supply system GP1 in that the third device GM23 includes the same number of the pipelines L4 and the valves V4 as the number of the pipelines L2 within the first device GM21. The gas exhaust line EL within the third device GM23 is connected to a pipeline between the gas exhaust device 50 and the gas exhaust device 51, like the gas exhaust line EL within the third device GM3 of the gas supply system GP1.

The second device GM22 includes multiple flow rate control unit groups FUG. In the example shown in FIG. 20, the number of the multiple flow rate control unit groups FUG within the second device GM22 is three. However, the number of the flow rate control unit groups FUG is not limited thereto. Each of the flow rate control unit groups FUG includes multiple flow rate control units FU. Each of the flow rate control units FU is equipped with the primary valve FV1, the flow rate controller FD and the secondary valve FV2. Further, in each flow rate control unit FU of the present exemplary embodiment, the primary valve FV1 and the secondary valve FV2 are disposed on the surface 212b, which is opposite to the surface 212a of the base 212 where the flow rate controller FD is provided, as illustrated in FIG. 2, for example; the flow rate controller FD and the primary valve FV1 are connected with the straight pipeline GL1 that penetrates the base 212; and the flow rate controller FD and the secondary valve FV2 are connected with the straight pipeline GL2 that penetrates the base 212, the same as in the first to third exemplary embodiments. Further, besides the primary valve FV1, the flow rate controller FD and the secondary valve FV2, other elements devices constituting the gas supply system GP2 illustrated in FIG. 20 are also separately provided on different surfaces of the base 212, and the element devices disposed on the different surfaces are connected with the straight pipeline which penetrates the base 212.

In the second device GM22, the number of the flow rate control units FU within each flow rate control unit group FUG is larger than the number of the flow rate control units FU within each flow rate control unit group FUG of the gas supply system GP1. The second device GM22 is equipped with multiple branch lines BL1 (first branch lines BL1), multiple branch lines BL2 (second branch lines BL2), multiple valves V5 (fifth valves V5), multiple valves V6 (sixth valves V6), multiple joint lines ML1 (first joint lines ML1) and multiple joint lines ML2 (second joint lines ML2).

Each of the multiple branch lines BL1 is connected to each corresponding one of the multiple flow rate control units FU. Each of the multiple branch lines BL2 is also connected to each corresponding one of the multiple flow rate control units FU. That is, a pair of the branch line BL1 and the branch line BL2 are branched from the output of each flow rate control unit FU. Each branch line BL1 is provided with corresponding one of the valves V5, and each branch line BL2 is provided with corresponding one of the valves V6.

The multiple joint lines ML1 are configured to merge gases from the multiple branch lines BL1 for each corresponding one of the flow rate control unit groups FUG. That is, connected to the single joint line ML1 are the multiple branch lines BL1 which are connected to the multiple flow rate control units FU within each corresponding one of the flow rate control unit groups FUG. Further, the multiple joint lines ML2 are configured to merge gases from the multiple branch lines BL2 belonging to each corresponding one of the flow rate control unit groups FUG. That is, connected to the single joint line ML2 are the multiple branch lines BL2 which are connected to the multiple flow rate control units FU within each corresponding one of the flow rate control unit groups FUG.

Furthermore, the second device GM22 of the gas supply system GP2 shown in FIG. 20 further includes multiple valves V7 (seventh valves V7), multiple valves V8 (eighth valves V8), multiple valves V9 (ninth valves V9) and multiple valves V10 (tenth valves V10).

Each joint line ML1 is connected to corresponding one of multiple gas discharging units within the shower head SH via the valve V7. Further, each joint line ML1 is connected to a pipeline between the gas exhaust device 50 and the gas exhaust device 51 via the valve V8. That is, each joint line ML1 is branched into a pipeline LA having the valve V7 and a pipeline LB having the valve V8. The pipeline LA joins a pipeline LM, and the pipeline LM is connected to corresponding one of the multiple gas discharging units within the shower head SH. Further, the pipeline LB is connected to the pipeline between the gas exhaust device 50 and the gas exhaust device 51.

Each joint line ML2 is connected to corresponding one of the multiple gas discharging units within the shower head SH via the valve V9. Further, each joint line ML2 is also connected to the pipeline between the gas exhaust device 50 and the gas exhaust device 51 via the valve V10. That is, each joint line ML2 is branched into a pipeline LC having the valve V9 and a pipeline LD having the valve V10. The pipeline LC joins the pipeline LM together with the pipeline LA which guides the gas from the same flow rate control unit group FUG, and the pipeline LM is connected to corresponding one of the multiple gas discharging units within the shower head SH. Further, the pipeline LD is connected to the pipeline between the gas exhaust device 50 and the gas exhaust device 51.

Further, the processing system 10c according to the present exemplary embodiment further includes a valve V11 (eleventh valve V11). The valve V11 is provided at a pipeline connecting the shower head SH and the gas exhaust line 52 (see FIG. 14) which is provided at a lower portion of the processing vessel 12. The valve V11 is opened when the gas within the gas supply system GP2 is exhausted. As the valve V11 is opened, the gas within the shower head SH is exhausted by the gas exhaust device 50. Accordingly, the gas within the shower head SH can be exhausted at a high speed.

Figure 21:
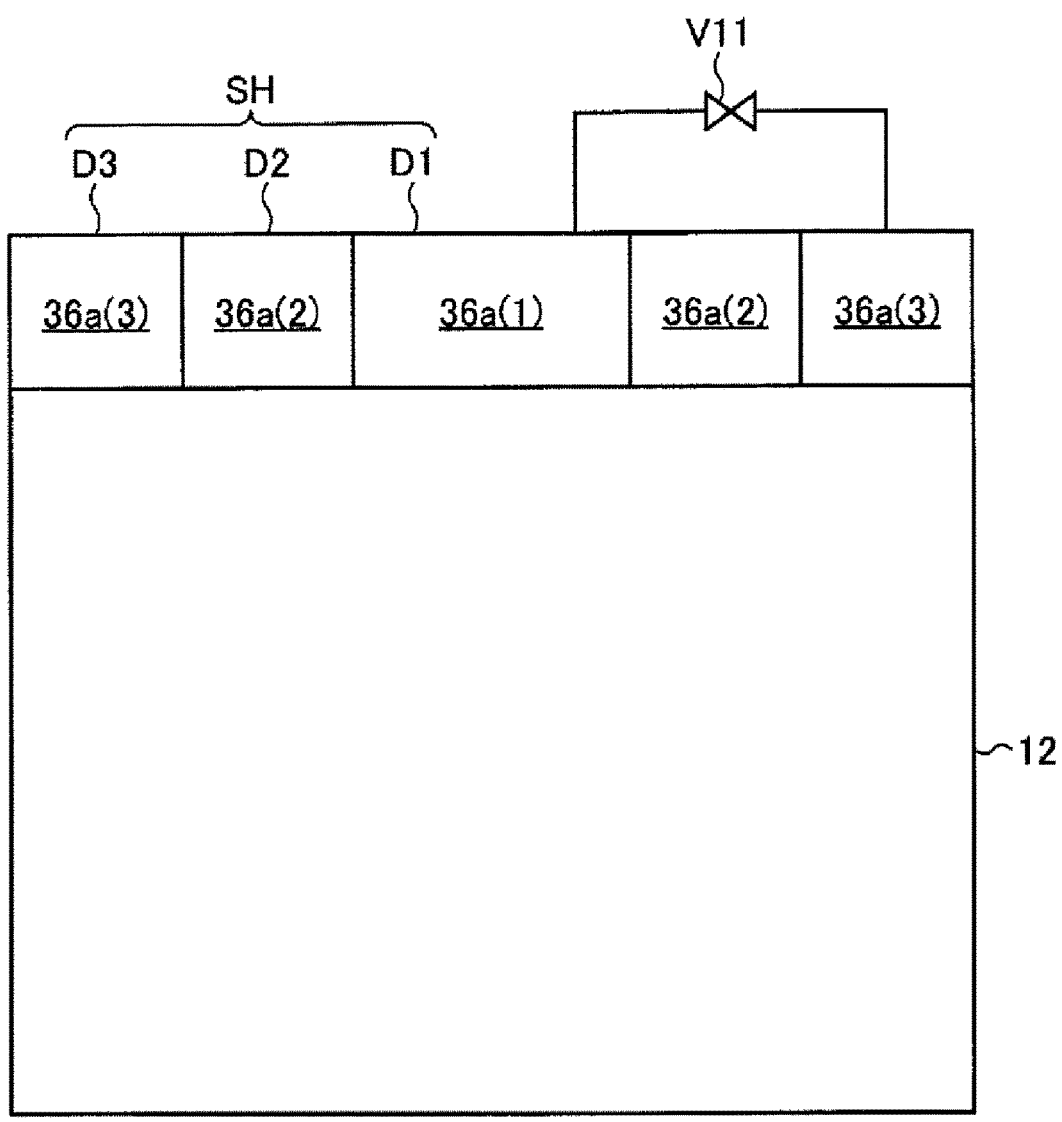
FIG. 21 is a diagram illustrating a modification example of arrangement of a valve V11.

FIG. 21 is a diagram illustrating a modification example of arrangement of the valve V11. As depicted in FIG. 21, the shower head SH includes the multiple gas discharging units, for example, a gas discharging unit D1, a gas discharging unit D2 and a gas discharging unit D3. The gas discharging unit D1 includes a gas diffusion space 36a(1); the gas discharging unit D2 includes a gas diffusion space 36a(2); and the gas discharging unit D3 includes a gas diffusion space 36a(3). In the modification example shown in FIG. 21, the number of gas discharge holes 34a connected to the gas diffusion space 36a(1) is smaller than the number of gas discharge holes 34a connected to the gas diffusion space 36a(3). Accordingly, a conductance of the gas discharging unit D3 is higher than a conductance of the gas discharging unit D1. For this reason, in order to exhaust the gas within the shower head SH at a high speed, the gas discharging unit D1 and the gas discharging unit D3 are connected by a pipeline which is equipped with the valve V11. The valve V11 is opened when the gas within the gas supply system GP2 is exhausted. Accordingly, when exhausting the gas within the gas supply system GP2, the gas flows from the gas discharging unit D1 into the gas discharging unit D3, and is exhausted at a high speed through a space within the processing vessel 12.

As in the gas supply system GP1, the gas remaining in the flow paths within the gas supply system GP2 can be replaced at a high speed, i.e., in a short time period. Further, from a measurement result of the pressure gauge PM, it can be determined whether the gas remaining within the gas supply system GP2 is completely exhausted. Further, the leakage of the valve V1 within the gas supply system GP2, if any, can also be detected from the measurement result of the pressure gauge PM.

Moreover, in the gas supply system GP2, by opening either one of the valve V5 and the valve V6 respectively provided on the pair of branch lines BL1 and BL2 connected to each flow rate control unit FU, a gas A from some of the multiple flow rate control units FU of each flow rate control unit group FUG can be supplied into the joint line ML1, and a gas B from the other multiple flow rate control units FU can be supplied into the joint line ML2.

According to the processing system 10c equipped with the gas supply system GP2 of the present exemplary embodiment, the gas A from the multiple joint lines ML1 and the gas B from the multiple joint lines ML2 can be supplied into the processing vessel 12 alternately. In case that the gas A and the gas B are different kinds of gases, it is possible to improve the throughput of the processing in which different plasma processes are performed on the semiconductor wafer W alternately.

Furthermore, according to the processing system 10c of the present exemplary embodiment, the gas A may be continuously supplied into the processing vessel 12 from the joint lines ML1, and the gas B may be supplied into the processing vessel 12 from the joint lines ML2 intermittently, that is, in a pulse shape. In such a case, the kind of the gas supplied into the processing vessel 12 via the joint lines ML2 may be the same as or different from the gas supplied into the processing vessel 12 via the joint lines ML1.

Figure 22:
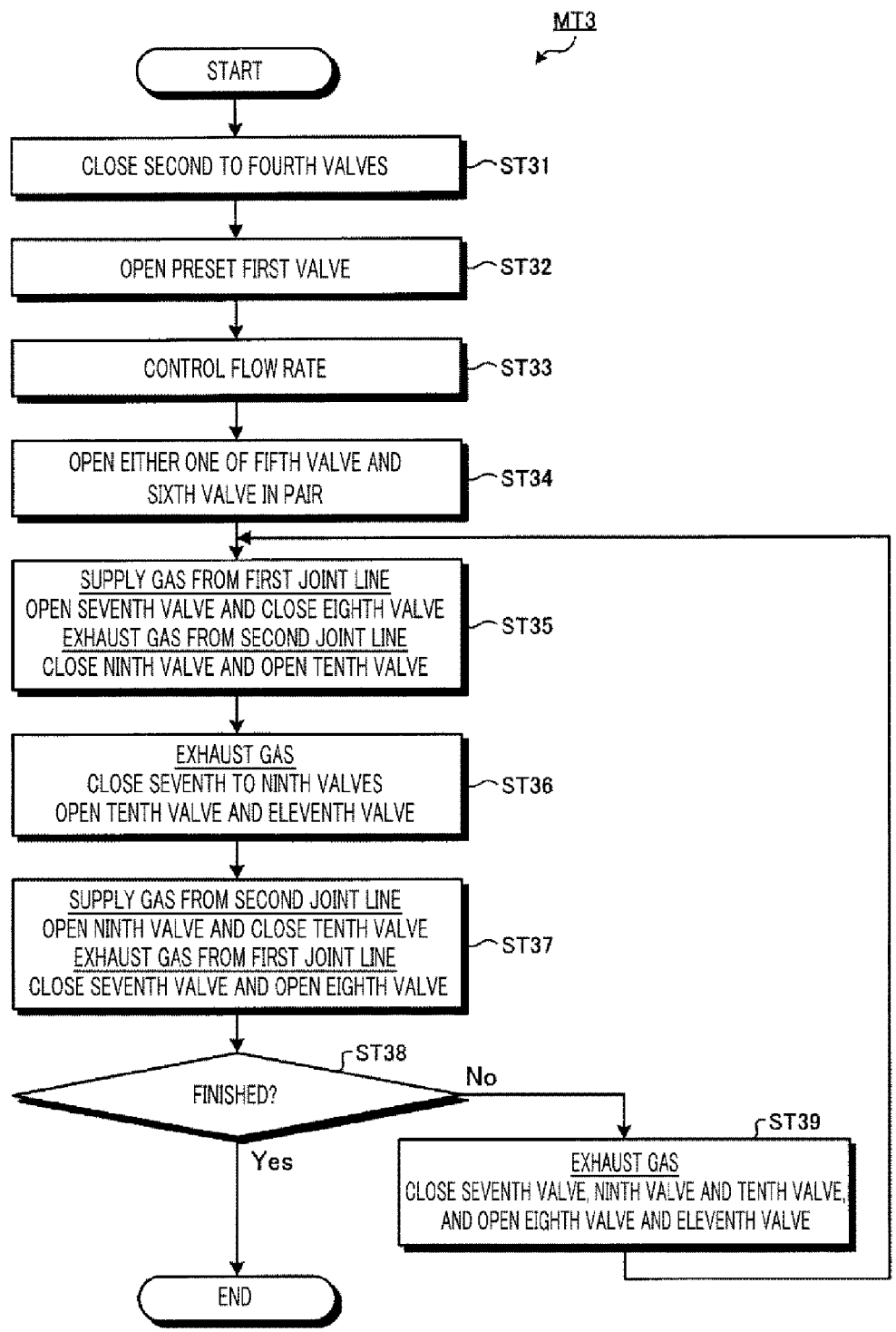
FIG. 22 is a flowchart for describing an example of an operation method for the processing system according to the fourth exemplary embodiment.
Figure 23:
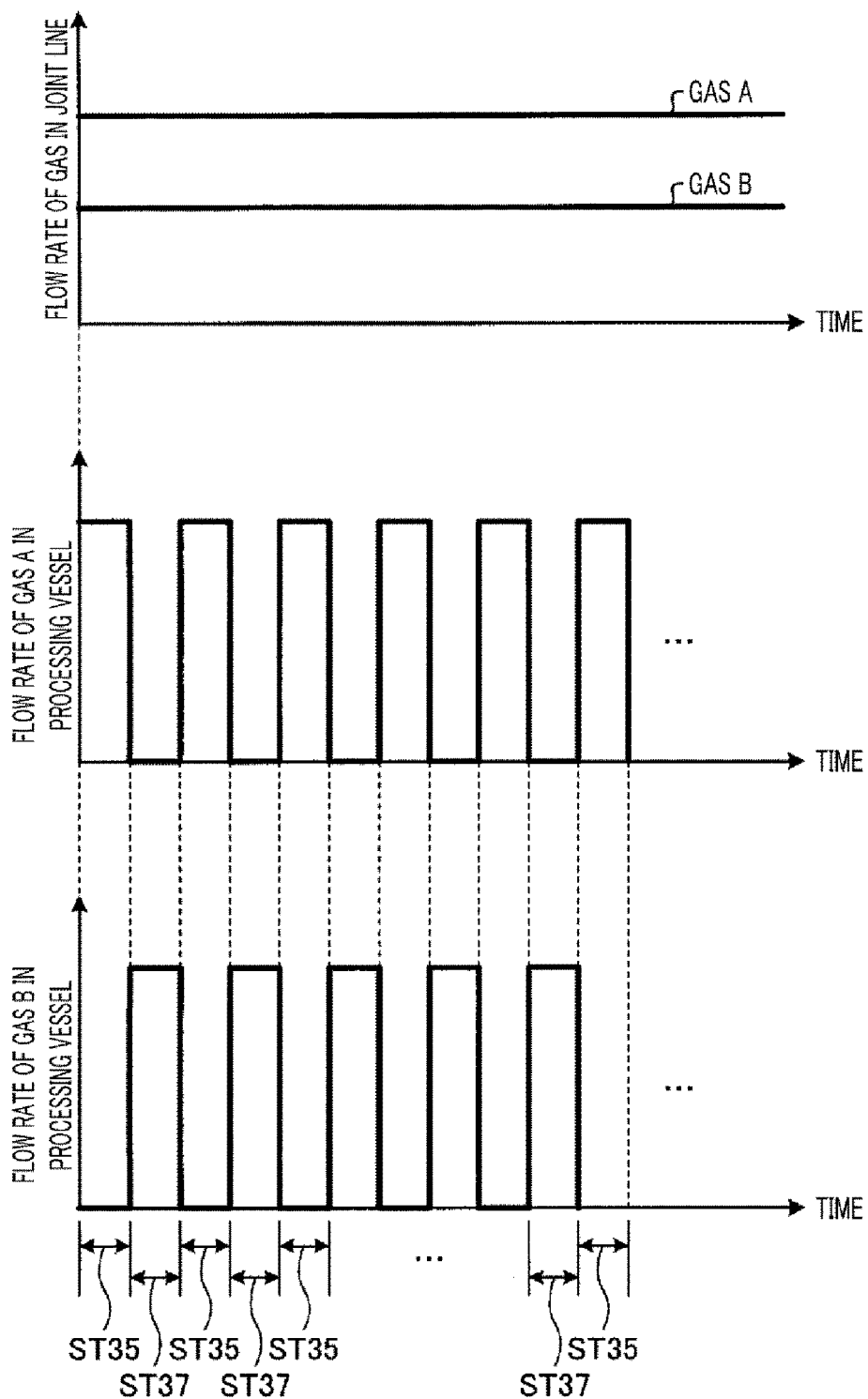
FIG. 23 is a timing chart illustrating an example of a variation of a flow rate of a gas in the operation method of FIG. 22.

Now, an operation method of the processing system 10c according to the fourth exemplary embodiment will be discussed. FIG. 22 is a flowchart for describing the operation method of the processing system 10c in the fourth exemplary embodiment. The operation method MT3 shown in FIG. 22 is directed to a method in which different kinds of plasma processes are performed alternately within the processing vessel 12 by supplying different kinds of gases into the processing vessel 12 alternately. FIG. 23 is a timing chart illustrating an example of the variation of the gas flow rate in the operation method shown in FIG. 22. An upper chart of FIG. 23 is a timing chart illustrating the flow rate of the gas A flowing through the joint line ML1 and the flow rate of the gas B flowing through the joint line ML2 after a process ST33 of the operation method MT3. Further, a middle chart of FIG. 23 is a timing chart illustrating the flow rate of the gas A flowing within the processing vessel 12 in processes ST35 and ST37. Further, a lower chart of FIG. 23 is a timing chart illustrating the flow rate of the gas B flowing within the processing vessel 12 in the processes ST35 and ST37. Below, description will be provided with reference to FIG. 22 and FIG. 23.

In the operation method MT3 according to the present exemplary embodiment, the valve V2, the valve V3 and all of the valves V4 are closed in a process ST31. In a subsequent process ST32, a preset valve V1 of the valves V1 is opened. In a subsequent process ST33, the flow rate of the gas is adjusted by the multiple flow rate control units FU of the multiple flow rate control unit groups FUG. In a subsequent process ST34, either one of the valve V5 and the valve V6, which are respectively provided on the pair of branch lines BL1 and BL2 connected to each flow rate control unit FU, is opened. That is, the gas A is supplied through the joint line ML1 from some of the multiple flow rate control units FU of each flow rate control unit group FUG, and the gas B is supplied through the joint line ML2 from the other flow rate control units FU of the multiple flow rate control units FU. For example, the gas A having the flow rate shown in the upper timing chart of FIG. 23 flows through the joint line ML1, and the gas B having the flow rate shown in the upper timing chart of FIG. 23 flows through the joint line ML2.

In the subsequent process ST35, the multiple valves V7 are opened, and the multiple valves V8 are closed. Further, the multiple valves V9 are closed, and the multiple valves V10 are opened. Accordingly, the gas A from the multiple joint lines ML1 is supplied into the shower head SH through the pipeline LM. Further, the gas B from the multiple joint lines ML2 is exhausted through the pipeline LD. Accordingly, as depicted in the middle and lower timing charts of FIG. 23, only the gas A is supplied into the processing vessel 12 in the process ST35. Then, the gas A supplied from the shower head SH is excited, so that a plasma process is performed on the semiconductor wafer W.

In a subsequent process ST36, the multiple valves V7, the multiple valves V8 and the multiple valves V9 are closed, and the multiple valves V10 are opened. Accordingly, the supply of the gas A into the shower head SH from the multiple joint lines ML1 is stopped. Further, the gas B from the multiple joint lines ML2 is exhausted through the pipeline LD. Furthermore, the valve V11 is opened. Accordingly, the gas within the shower head SH is exhausted. Then, the valve V11 is closed.

In the subsequent process ST37, the multiple valves V9 are opened, and the multiple valves V10 are closed. Further, the multiple valves V7 are closed, and the multiple valves V8 are opened. Accordingly, the gas B is supplied into the shower head SH from the multiple joint lines ML2 through the pipeline LM. Further, the gas A from the multiple joint lines ML1 is exhausted through the pipeline LB. Accordingly, as depicted in the middle and lower timing charts of FIG. 23, only the gas B is supplied into the processing vessel 12 in the process ST37. Then, the gas B supplied from the shower head SH is excited, so that a plasma process different from the plasma process in the process ST35 is performed on the semiconductor wafer W.

In a subsequent process ST38, it is determined whether the alternating repetition of the process ST35 and the process ST37 needs to be finished. By way of example, in the process ST38, it is determined whether the process ST35 and the process ST37 are repeated a preset number of times. If it is determined in the process ST38 that the alternating repetition of the process ST35 and the process ST37 is not finished, a process ST39 is performed.

In the process ST39, the multiple valves V7, the multiple valves V9 and the multiple valves V10 are closed, and the multiple valves V8 are opened. Accordingly, the supply of the gas B into the shower head SH from the multiple joint lines ML2 is stopped. Further, the gas A from the multiple joint lines ML1 is exhausted through the pipeline LB. Further, the valve V11 is opened. Accordingly, the gas within the shower head SH is exhausted. Then, the valve V11 is closed, and the processes from ST35 are performed again.

Meanwhile, if it is determined in the process ST38 that the alternating repetition of the process ST35 and the process ST37 is finished, the operation method MT3 is ended. Further, the processes from ST31 to ST39 are implemented as the individual components of the processing apparatus 101*b* are operated under the control of the controller Cnt. According to the operation method MT3 of the present exemplary embodiment, the gas A from the multiple joint lines ML1 and the gas B from the multiple joint lines ML2 can be supplied into the processing vessel 12 alternately, and the gas which is not currently supplied into the processing vessel 12 can be exhausted to the gas exhaust side. Accordingly, the gases supplied into the processing vessel 12 can be replaced at a high speed. Thus, it is possible to improve the throughput of the processing in which the different kinds of plasma processes are performed on the semiconductor wafer W alternately.

Here, examples of the gas A and the gas B used in the operation method MT3 are specified. FIG. 24 is a table which provides examples of the gas A used in the process ST35 and the gas B used in the process ST37 shown in the flowchart of FIG. 22. In the table shown in FIG. 24, the gas A and the gas B in dotted cells are meant to be exhausted in the corresponding process, and the gas A and the gas B in non-dotted cells are meant to be supplied into the processing vessel 12 in the corresponding process.

As depicted in FIG. 24, a mixed gas containing an $O_2$ gas, an Ar gas and a $CF_4$ gas may be used as the gas A supplied into the processing vessel 12 in the first time of process ST35, for example. Further, a mixed gas containing an $O_2$ gas, an Ar gas and a $SiCl_4$ gas may be used as the gas B exhausted in the first time of process ST35. Further, in the first time of process ST35, the gas A is configured to etch an etching target layer such as a silicon oxide film, and the gas B is a deposition gas. That is, in the first time of process ST35, the etching target layer is etched, and the deposition gas B may be prepared for the subsequent process ST37.

The gas A exhausted in the subsequent process ST37 is a mixed gas containing an $O_2$ gas and an Ar gas, and the gas B supplied into the processing vessel 12 in the process ST37 is a mixed gas containing an $O_2$ gas, an Ar gas and a $SiCl_4$ gas. That is, in the process ST37, a deposit is formed on the processing target object having the etching target layer, and another gas A can be prepared for the subsequent process ST35.

The gas A supplied into the processing vessel 12 in the subsequent process ST35 is a mixed deposition gas containing an $O_2$ gas and an Ar gas, and the gas B exhausted in the corresponding process ST35 is a mixed gas containing an $O_2$ gas, an Ar gas and a $CF_4$ gas. That is, in the corresponding process ST35, a deposit is formed on the processing target object, and the gas B configured to etch the etching target layer can be prepared.

The gas B supplied into the processing vessel 12 in the subsequent process ST37 is a mixed etching gas containing an $O_2$ gas, an Ar gas and a $CF_4$ gas, and the gas A exhausted in the corresponding process ST37 is a mixed deposition gas containing an $O_2$ gas, an Ar gas and a $SiCl_4$ gas. That is, in the corresponding process ST37, the etching target layer is etched, and the deposition gas A may be prepared for the subsequent process ST35. In the subsequent processes ST35 and ST37, one of the appropriate gas A and the appropriate gas B is supplied into the processing vessel 12 while the other is exhausted.

As stated above, according to the processing system 10c of the present exemplary embodiment, the element devices constituting the gas supply system GP2 are separately provided on different surfaces of the base 212, and the element devices disposed on the different surfaces are connected with the straight pipeline which penetrates the base 212, as illustrated in FIG. 2, for example. With this configuration, the volume of the pipeline connecting the individual element devices constituting the gas supply system GP2 can be reduced, so that the exhaust time for the gas remaining in the pipeline can be shortened. Therefore, in the processing of the present exemplary embodiment in which the different kinds of gases such as the etching gas A and the deposition gas B are supplied into the processing vessel 12 while being intermittently changed in a pulse shape, each pulse width can be shortened. Thus, in the processing where different kinds of plasma processes are alternately performed on the semiconductor wafer W while changing different kinds of gases, the throughput of the processing can be improved.

Furthermore, since the volume of the pipeline connecting the individual element devices constituting the gas supply system GP2 can be reduced, the responsiveness of the gas flow rate can be improved, and the waiting time required for the gas flow rate to be stabilized within the processing vessel 12 can be shortened. Accordingly, in the processing of the present exemplary embodiment in which the different kinds of gases are supplied into the processing vessel 12 while being intermittently changed in the pulse shape, each pulse width can be shortened. Thus, in the processing where different kinds of plasma processes are alternately performed on the semiconductor wafer W while changing different kinds of gases, the throughput of the processing can be improved.

Moreover, since the volume of the pipeline connecting the individual element devices constituting the gas supply system GP2 can be reduced, the amount of the gas exhausted when replacing the gas can be reduced. Therefore, the waste amount of the gas can be reduced.

[Fifth Exemplary Embodiment]

Figure 25:
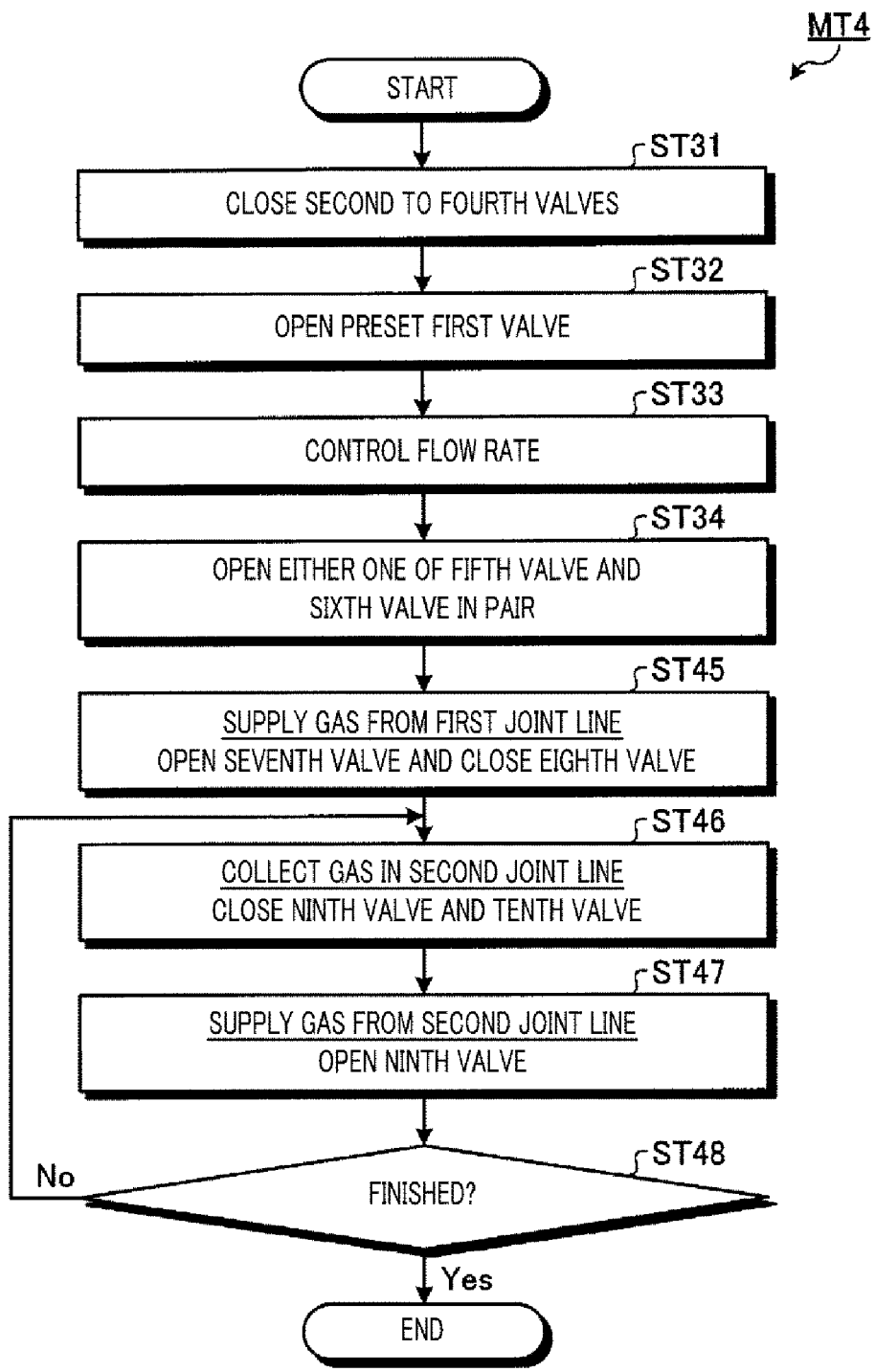
FIG. 25 is a flowchart for describing an example of an operation method for a processing system according to a fifth exemplary embodiment.

Now, a fifth exemplary embodiment will be elaborated. FIG. 25 is a flowchart for describing an example of an operation method of the processing system 10c in the fifth exemplary embodiment. The operation method MT4 shown in FIG. 25 is directed to a method in which a plasma process is performed by supplying the gas A into the processing vessel 12 continuously and supplying the gas B into the processing vessel 12 intermittently, i.e., in the pulse shape. Further, the processing system 10c of the present exemplary embodiment is the same as the processing system 10c described in the fourth exemplary embodiment, redundant description thereof will be omitted.

Figure 26:
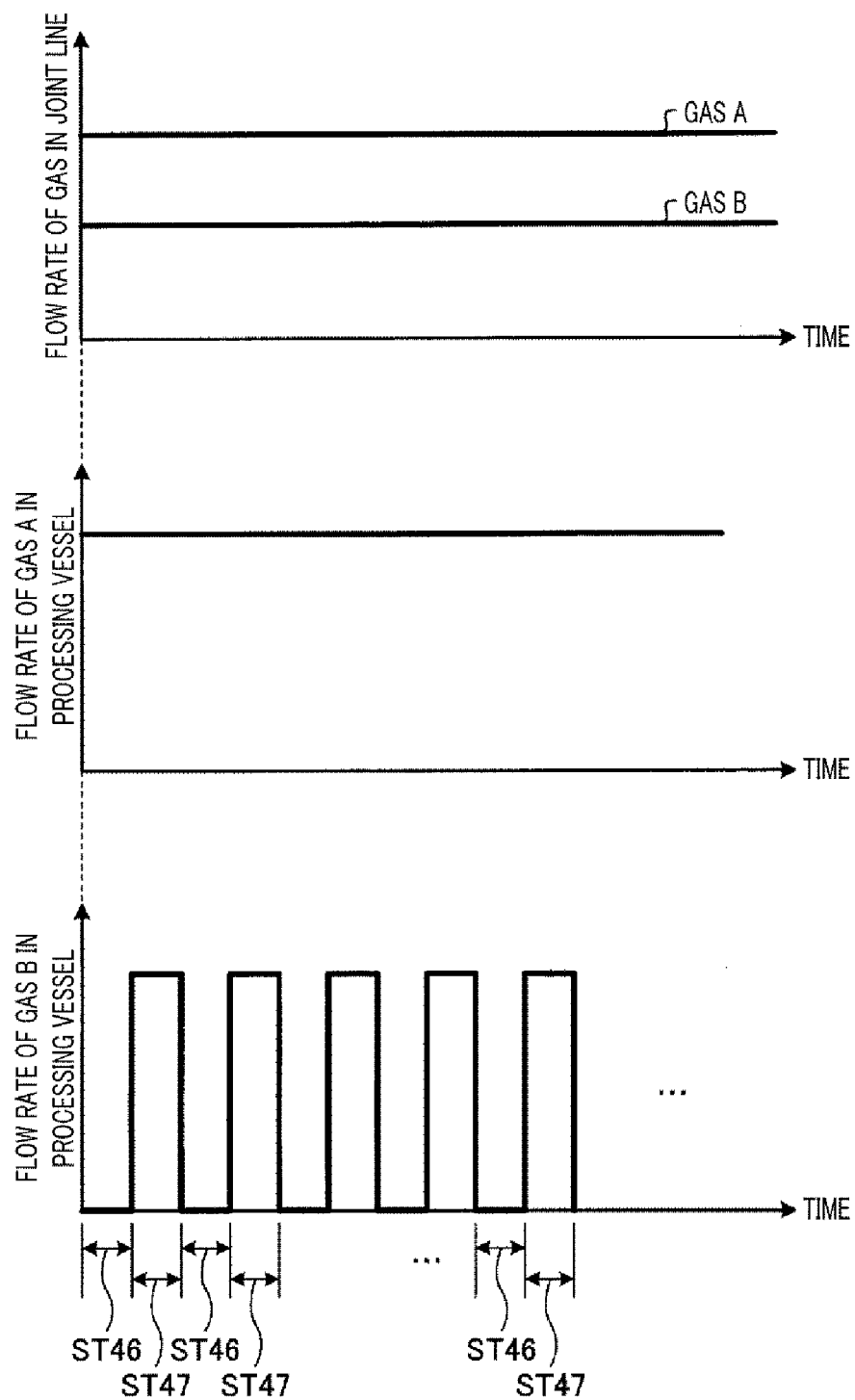
FIG. 26 is a timing chart illustrating an example of a variation of a flow rate of a gas in the operation method of FIG. 25.

FIG. 26 is a timing chart illustrating an example of the variation of the gas flow rate in the operation method MT4 shown in FIG. 25. An upper chart of FIG. 26 is a timing chart illustrating the flow rate of the gas A flowing through the joint line ML1 and the flow rate of the gas B flowing through a joint line ML2 after a process ST46 of the operation method MT4. Further, a middle chart of FIG. 26 is a timing chart illustrating the flow rate of the gas A flowing within the processing vessel 12 in processes ST46 and ST47. Further, a lower chart of FIG. 26 is a timing chart illustrating the flow rate of the gas B flowing within the processing vessel 12 in the processes ST46 and ST47. Below, description will be provided with reference to FIG. 25 and FIG. 26.

In the operation method MT4 according to the present exemplary embodiment, the same processes as the processes ST31 to ST34 of the operation method MT3 are first performed. In a subsequent process ST45, the multiple valves V7 are opened, and the multiple valves V8 are closed. Accordingly, the gas A from the joint lines ML1 is supplied into the shower head SH. Almost concurrently, the multiple valves V9 and the multiple valves V10 are closed in the process ST46. As a result, the gas B is collected in the flow paths upstream of the valves V9 and the valves V10. At this time, a pressure in the flow paths at the upstream side, i.e., within the flow paths including the joint lines ML2 is higher than a pressure in the flow paths within the joint lines ML1 through which the gas A is flown. In performing the process ST46, the gas A is excited within the processing vessel 12, and the semiconductor wafer W is processed by plasma of the gas A.

In the subsequent process ST47, the multiple valves V9 are opened. Accordingly, the gas B collected in the flow paths upstream of the valves V9 and the valves V10 is supplied into the shower head SH, and the gas B is then supplied into the processing vessel 12 from the shower head SH. Within the processing vessel 12, a mixed gas of the gas A and the gas B are excited, so that the semiconductor wafer W is processed by plasma of the mixed gas. Further, in the process ST46, since the pressure within the flow paths including the joint lines ML2 through which the gas B is flown is set to a high pressure, it is possible to supply the gas B having a flow rate lower than that of the gas A into the shower head SH while mixing the gas B in the pipeline LM.

In a subsequent process ST48, it is determined whether the alternating repetition of the process ST46 and the process ST47 needs to be finished. By way of example, in the process ST48, it is determined whether the process ST46 and the process ST47 are repeated a preset number of times. If it is determined in the process ST48 that the alternating repetition of the process ST46 and the process ST47 is not finished, the processes from ST46 are performed again. Meanwhile, if it is determined in the process ST48 that the alternating repetition of the process ST46 and the process ST47 is finished, the operation method MT4 is ended.

According to the operation method MT4 of the present exemplary embodiment, the gas B can be intermittently supplied at a high speed while the gas A is supplied into the processing vessel 12 continuously. Further, the gas A and the gas B may be the same gas or different gases. Therefore, a plasma process using the gas A and a plasma process in which the gas B, which is different from the gas A, is added to the gas A can be performed alternately. Moreover, a plasma process using the gas A and a plasma process in which the gas B, which is the same as the gas A, is added to the gas A, that is, in which the flow rate of the gas A is increased can be performed alternately.

Here, in the processing system 10c of the present exemplary embodiment as well, the element devices constituting the gas supply system GP2 are separately provided on different surfaces of the base 212, and the element devices disposed on the different surfaces are connected with the straight pipeline which penetrates the base 212, as illustrated in FIG. 2, for example. With this configuration, the volume of the pipeline connecting the individual element devices constituting the gas supply system GP2 can be reduced, so that the exhaust time for the gas remaining in the pipeline can be shortened. Therefore, in the processing of the present exemplary embodiment in which the gas A is continuously supplied into the processing vessel 12 and the gas B is intermittently supplied into the processing vessel 12 in the pulse shape, each pulse width can be shortened. Thus, in the processing where a plasma process upon the semiconductor wafer W with the gas A and another plasma process upon the semiconductor wafer W with the gas A and the gas B are conducted alternately, the throughput of the processing can be improved.

Furthermore, since the volume of the pipeline connecting the individual element devices constituting the gas supply system GP2 can be reduced, the responsiveness of the gas flow rate can be improved, and the waiting time required for the gas flow rate to be stabilized within the processing vessel 12 can be shortened. Accordingly, in the processing of the present exemplary embodiment in which the gas B is intermittently supplied into the processing vessel 12 in the pulse shape, each pulse width for the gas B can be shortened. Thus, in the processing where a plasma process upon the semiconductor wafer W with the gas A and another plasma process upon the semiconductor wafer W with the gas A and the gas B are conducted alternately, the throughput of the processing can be improved.

[Sixth Exemplary Embodiment]

Figure 27:
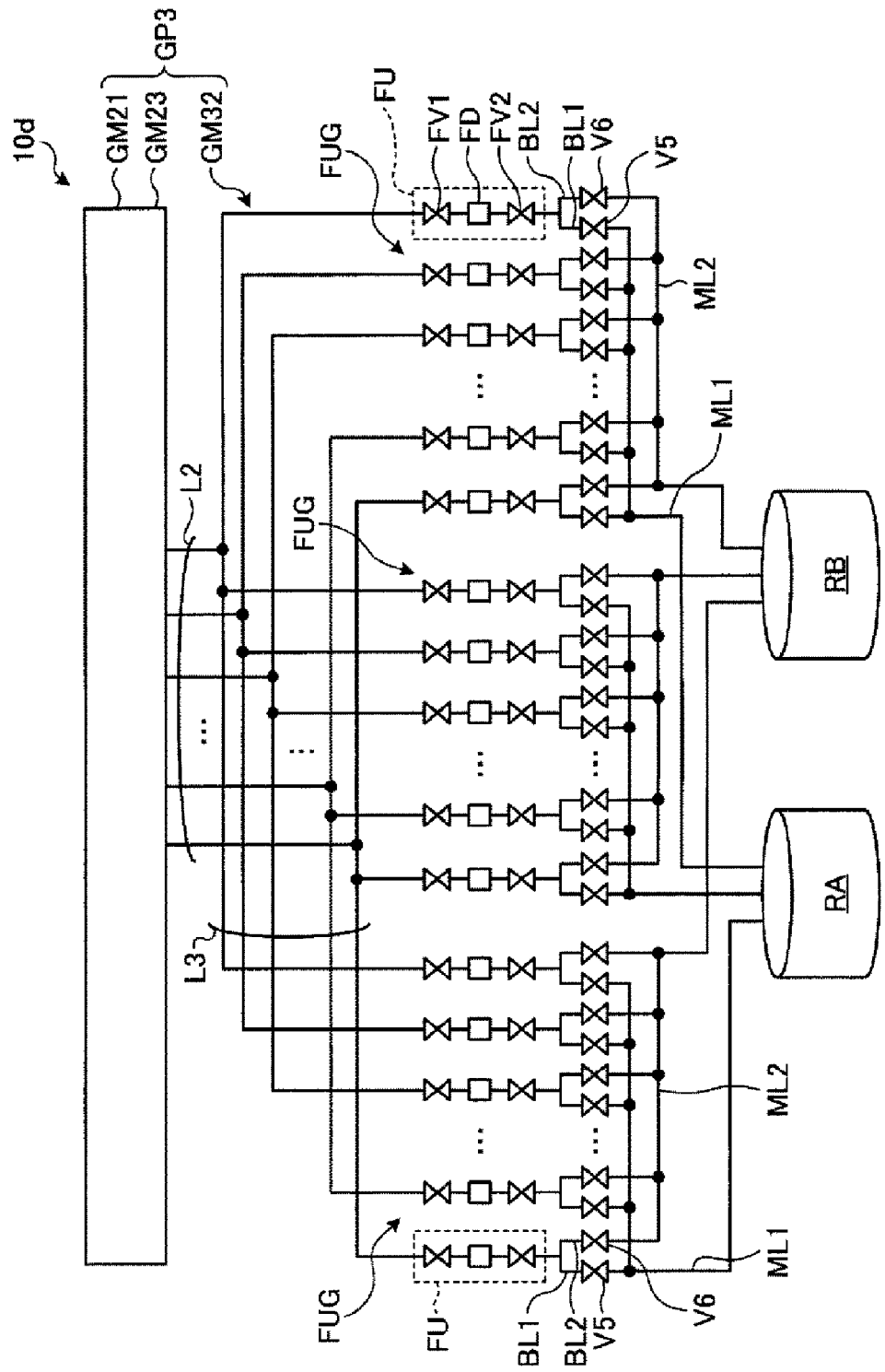
FIG. 27 is a diagram illustrating an example of a processing system according to a sixth exemplary embodiment.

Now, a sixth exemplary embodiment will be described. FIG. 27 is a diagram illustrating an example of a processing system 10d according to the sixth exemplary embodiment. The processing system 10d depicted in FIG. 27 includes a gas supply system GP3, a reactor unit RA and a reactor unit RB. The reactor unit RA and the reactor unit RB are the same as the reactor unit (processing apparatus 101a or the processing apparatus 101b) described in the first or the second exemplary embodiment.

The gas supply system GP3 is equipped with the first device GM21 and the third device GM23, as in the gas supply system GP2 of the fourth exemplary embodiment described above with reference to FIG. 20. The gas supply system GP3 of the present exemplary embodiment further includes a second device GM32. Further, in the processing system 10c of the fourth exemplary embodiment, the joint lines ML1 and the joint lines ML2 of the second device GM22 are connected to the shower head SH of the single reactor unit. However, in the processing system 10d of the present exemplary embodiment, multiple joint lines ML1 of the second device GM32 are respectively connected to the multiple gas discharging units of the shower head SH of the reactor unit RA, and multiple joint lines ML2 are connected to multiple gas discharging units of the shower head SH of the reactor unit RB.

Further, in the processing system 10d of the present exemplary embodiment, the gas exhaust line EL of the third device GM23 may be connected to the pipeline between the gas exhaust device 50 and the gas exhaust device 51 of the reactor unit RA or the pipeline between the gas exhaust device 50 and the gas exhaust device 51 of the reactor unit RB. Furthermore, in each flow rate control unit FU of the present exemplary embodiment, the primary valve FV1 and the secondary valve FV2 are disposed on the surface 212b, which is opposite to the surface 212a of the base 212 where the flow rate controller FD is provided, as described above with reference to FIG. 2, for example; the flow rate controller FD and the primary valve FV1 are connected by the straight pipeline GL1 which penetrates the base 212; and the flow rate controller FD and the secondary valve FV2 are connected by the straight pipeline GL2 which penetrates the base 212, as in the first to the fifth exemplary embodiment.

In the processing system 10d of the present exemplary embodiment, by using the single gas supply system GP3, the gas A can be supplied into the processing vessel 12 of the reactor unit RA and the gas B can be supplied into the processing vessel 12 of the rector unit RB. The gas A and the gas B may be the same gas or different gases. In case that the gas A and the gas B are of different kinds, different plasma processes can be performed in the reactor unit RA and the reactor unit RB. Meanwhile, if the gas A and the gas B are the same kind of gas, same plasma process can be performed in the reactor unit RA and the reactor unit RB.

Here, in the processing system 10d of the present exemplary embodiment as well, the element devices constituting the gas supply system GP3 are separately provided on different surfaces of the base 212, and the element devices disposed on the different surfaces are connected with the straight pipeline which penetrates the base 212, as illustrated in FIG. 2, for example. With this configuration, the volume of the pipeline connecting the individual element devices constituting the gas supply system GP3 can be reduced, so that the exhaust time for the gas remaining in the pipeline can be shortened. Therefore, in the processing in which different kinds of gases are supplied into the processing vessel 12 of each reactor unit while being changed, the waiting time required for the gas to be replaced can be shortened. Thus, in the processing where different kinds of plasma processes are alternately performed on semiconductor wafers W while changing different kinds of gases in the reactor units, the throughput of the processing can be improved.

Furthermore, since the volume of the pipeline connecting the individual element devices constituting the gas supply system GP3 can be reduced, the responsiveness of the gas flow rate can be improved, and the waiting time required for the gas flow rate to be stabilized within the processing vessel 12 of each reactor unit can be shortened. In the processing in which different kinds of gases are supplied into the processing vessel 12 of each reactor unit while being changed, the supply time of each kind of the gases can be shortened. Thus, in the process where different kinds of plasma processes are alternately performed on semiconductor wafers W while changing different kinds of gases in the reactor units, the throughput of the processing performed in each reactor unit can be improved.

Moreover, since the volume of the pipeline connecting the individual element devices constituting the gas supply system GP3 can be reduced, the amount of the gas exhausted when replacing the gas can be reduced. Therefore, the waste amount of the gas can be reduced in the processing of the reactor units.

In the above, the gas supply system and the gas supply control method have been described with respect to the various exemplary embodiments. However, the gas supply system and the gas supply control method are not limited to the above-described exemplary embodiments, and various changes and modifications may be made without departing from the scope of the present disclosure. Further, unless contradictory, the disclosures in the various exemplary embodiments can be combined appropriately.

For example, in the above-described exemplary embodiments, the capacitively coupled plasma processing apparatus is described as the processing apparatus. However, the inventive concept of the present disclosure may also be applicable to various other types of plasma processing apparatuses such as an inductively coupled plasma processing apparatus, a plasma processing apparatus with a microwave as a plasma source, and so forth. Furthermore, in the processing apparatus included in each of the above-described processing system, the gas discharging units are provided in the shower head. However, the gas discharging units may be provided in any forms as long as they are configured to supply the gas toward different zones within the processing vessel, i.e., multiple regions on the processing target object.

In addition, the processing target object processed in the processing apparatus in the above-described exemplary embodiments is not limited to the semiconductor wafer W. By way of non-limiting example, the processing target object may be a large-size substrate for a flat panel display, a substrate for an EL (electroluminescence) device or a solar cell, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A gas supply system of supplying a gas into a processing apparatus, comprising:
   a plurality of element devices which constitute the gas supply system; and
   a base on which the plurality of element devices are disposed,
   wherein some of the plurality of element devices are disposed on a first surface of the base and the others of the plurality of element devices are disposed on a second surface of the base, which is opposite to the first surface of the base,
   wherein the plurality of element devices comprise:
   a flow rate controller configured to control a flow rate of the gas;
   an upstream valve whose upstream side is connected to a supply source of the gas and whose downstream side is connected to the flow rate controller in a direction along which the gas is flown; and
   a downstream valve whose upstream side is connected to the flow rate controller and whose downstream side is connected to the processing apparatus in the direction along which the gas is flown,
   wherein the flow rate controller is a pressure type flow rate control device equipped with a control valve and an orifice, and
   a volume $V_1$ of a flow path of the gas between the control valve and the orifice and a volume $V_2$ of a flow path of the gas between the orifice and the downstream valve satisfy a relationship of $V_1/V_2 \geq 9$.

2. The gas supply system of claim 1,
   wherein the flow rate controller is disposed on the first surface of the base, and
   the upstream valve and the downstream valve are disposed on the second surface of the base.

3. The gas supply system of claim 2, further comprising:
   a first pipeline, configured to connect the upstream valve and the flow rate controller, through which the gas is flown; and
   a second pipeline, configured to connect the flow rate controller and the downstream valve, through which the gas is flown,
   wherein each of the first pipeline and the second pipeline has a straight line shape and penetrates the base.

4. The gas supply system of claim 1,
   wherein the volume $V_1$ of the flow path of the gas between the control valve and the orifice and the volume $V_2$ of the flow path of the gas between the orifice and the downstream valve satisfy a relationship of $V_1/V_2 \leq 200$.

5. The gas supply system of claim 3,
   wherein the upstream valve is connected to a gas exhaust device via a gas exhaust valve.

* * * * *